United States Patent
Higashi et al.

(10) Patent No.: US 7,071,090 B2
(45) Date of Patent: Jul. 4, 2006

(54) SEMICONDUCTOR ELEMENT HAVING PROTRUDED BUMP ELECTRODES

(75) Inventors: Kazushi Higashi, Neyagawa (JP); Norihito Tsukahara, Souraku-gun (JP); Takahiro Yonezawa, Neyagawa (JP); Yoshihiko Yagi, Ashiya (JP); Yoshifumi Kitayama, Hirakata (JP); Hiroyuki Otani, Ikoma (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/073,714

(22) Filed: Mar. 8, 2005

(65) Prior Publication Data

US 2005/0146029 A1    Jul. 7, 2005

Related U.S. Application Data

(62) Division of application No. 09/768,246, filed on Jan. 25, 2001, now Pat. No. 6,894,387, which is a division of application No. 08/940,981, filed on Sep. 30, 1997, now Pat. No. 6,207,549.

(30) Foreign Application Priority Data

Oct. 1, 1996 (JP) .................. 8-260645
Oct. 31, 1996 (JP) .................. 8-289836

(51) Int. Cl.
*H01L 21/44* (2006.01)

(52) U.S. Cl. ............ 438/617; 438/615; 438/613; 257/E23.024

(58) Field of Classification Search ............ 438/613, 438/615, 617; 257/E23.024
See application file for complete search history.

(56) References Cited

U.S. PATENT DOCUMENTS

| | | |
|---|---|---|
| 4,323,759 A | 4/1982 | Edson |
| 4,661,192 A | 4/1987 | McShane |
| 4,911,350 A | 3/1990 | Araki et al. |
| 4,974,767 A | 12/1990 | Alfaro et al. |
| 5,014,111 A | 5/1991 | Tsuda et al. |
| 5,060,843 A | 10/1991 | Yasuzato et al. |
| 5,172,851 A | 12/1992 | Matsushita et al. |
| 5,226,582 A | 7/1993 | Kubota et al. |
| 5,246,159 A | 9/1993 | Kitamura et al. |
| 5,421,503 A | 6/1995 | Perlberg et al. |
| 5,476,211 A | 12/1995 | Khandros |
| 5,485,949 A | 1/1996 | Tomura et al. |
| 5,508,561 A | 4/1996 | Tago et al. |
| 5,518,964 A | 5/1996 | DiStefano et al. |
| 5,884,830 A | 3/1999 | Yamazaki et al. |
| 5,917,707 A | 6/1999 | Khandros et al. |
| 6,207,549 B1 * | 3/2001 | Higashi et al. ............ 438/613 |

FOREIGN PATENT DOCUMENTS

EP    0 320 244    6/1989

(Continued)

*Primary Examiner*—Nitin Parekh
(74) *Attorney, Agent, or Firm*—Wenderoth, Lind & Ponack, L.L.P.

(57) ABSTRACT

A method of forming a bump electrode on an IC electrode includes the steps of forming a ball bond on an IC electrode by a wire bonding apparatus, moving a bonding capillary upward, moving the bonding capillary sideways and then downward, bonding an Au wire to the ball bond portion, and cutting the Au wire. The Au wire is prevented from coming in contact with portions around the ball bond portion other than the ball bond portion by presetting a descent position of the bonding capillary to a position higher than a position in which the ball bond is formed.

5 Claims, 21 Drawing Sheets

FOREIGN PATENT DOCUMENTS

| | | |
|---|---|---|
| EP | 0 402 756 | 12/1990 |
| EP | 0 320 244 B1 | 3/1994 |
| JP | 59208751 | 11/1984 |
| JP | 62256445 | 11/1987 |
| JP | 01-151182 | 6/1989 |
| JP | 03-014235 | 1/1991 |
| JP | 3019251 | 1/1991 |
| JP | 03-050831 | 3/1991 |
| JP | 3108347 | 5/1991 |
| JP | 6309985 | 11/1994 |
| JP | 07-099202 | 4/1995 |
| JP | 08-008308 | 1/1996 |
| JP | 8055855 | 2/1996 |
| JP | 08-162489 | 6/1996 |
| JP | 09-181120 | 7/1997 |

\* cited by examiner

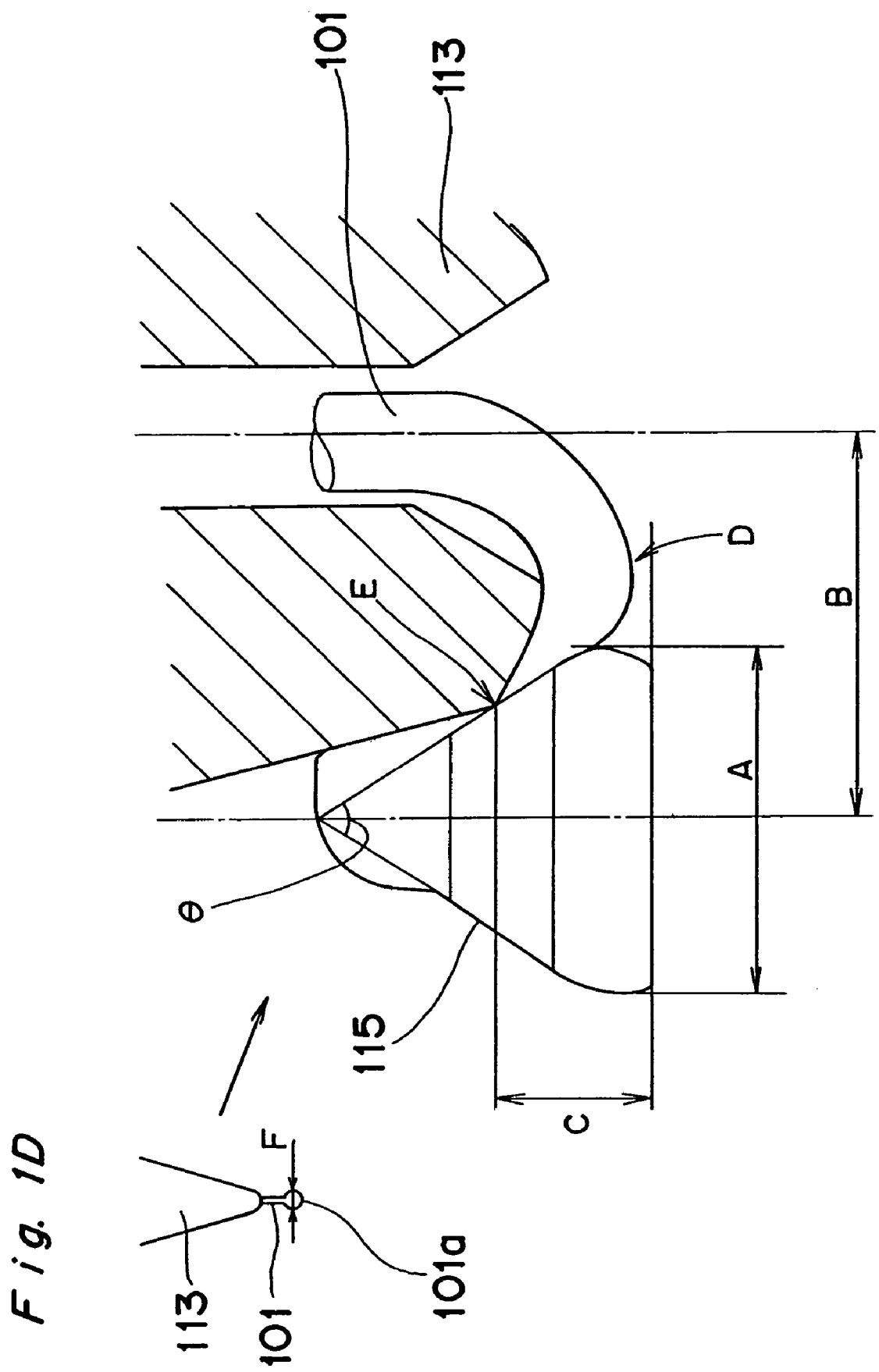

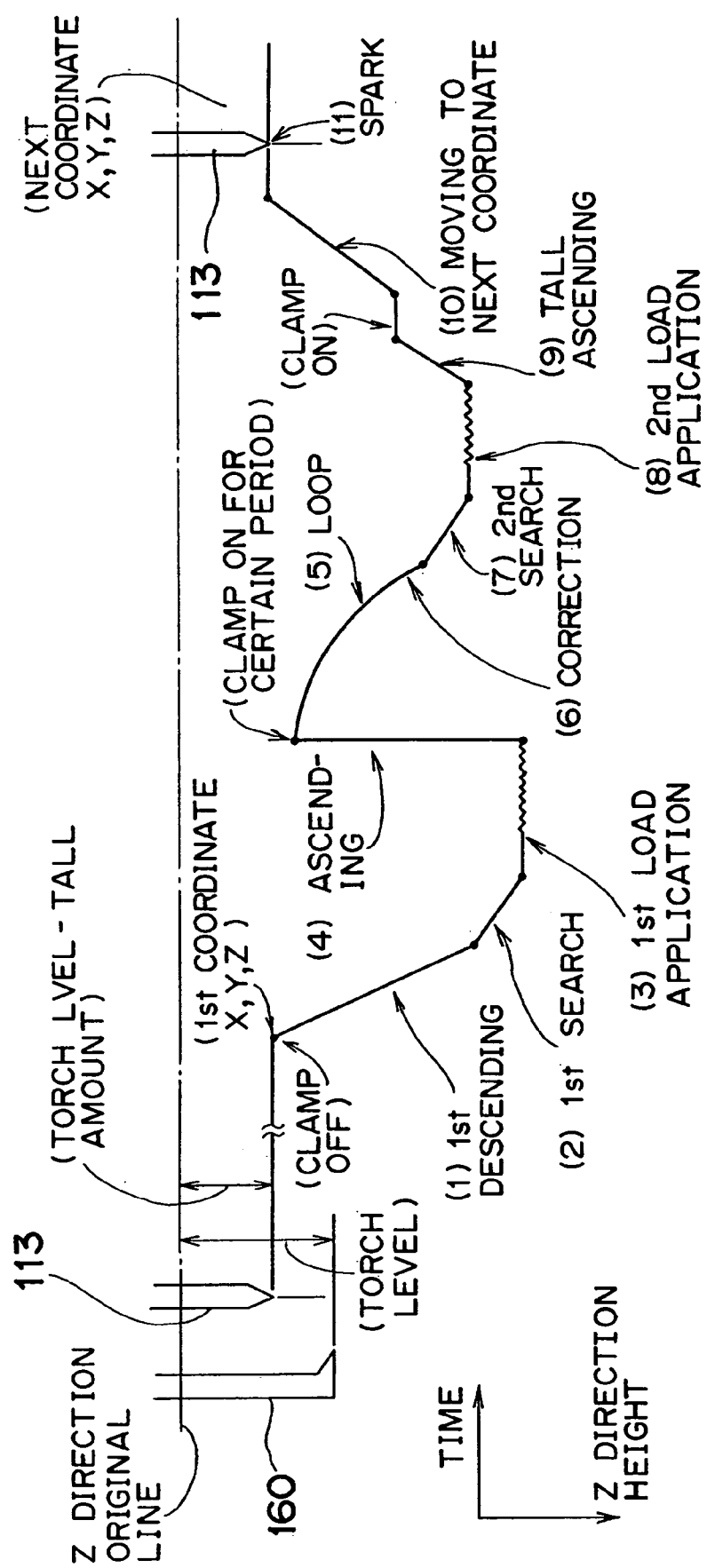

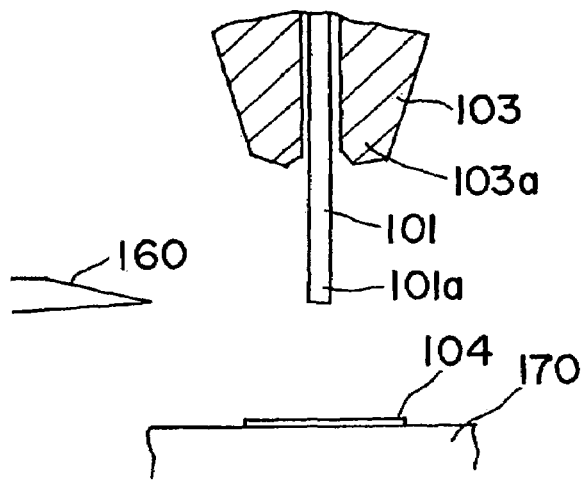
Fig.18A
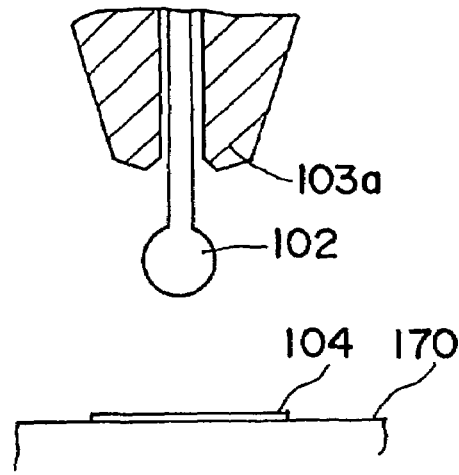
Fig.18B
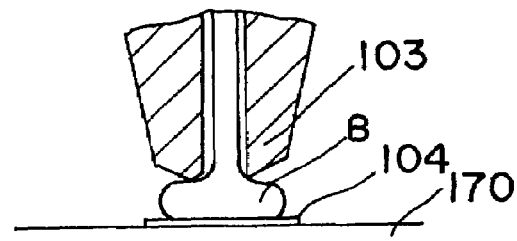
Fig.18C
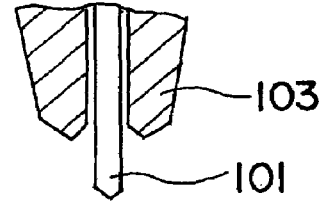
Fig.18D
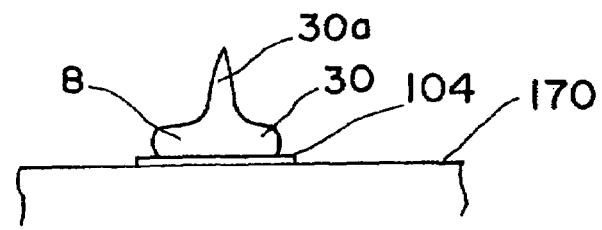

SEMICONDUCTOR ELEMENT HAVING PROTRUDED BUMP ELECTRODES

This application is a divisional application of application Ser. No. 09/768,246, filed Jan. 25, 2001, now U.S. Pat. No. 6,894,387, which is a divisional application of application Ser. No. 08/940,981, filed Sep. 30, 1997, now U.S. Pat. No. 6,207,549.

BACKGROUND OF THE INVENTION

The present invention relates to a semiconductor element in which a bump is formed on an electrode of the semiconductor element by a ball bonding method or the like using a metal thin wire (wire), that is, a method of forming a bump electrode on an IC electrode, a method of fabricating the semiconductor element, a semiconductor device fabricated with the semiconductor element and a method of fabricating the semiconductor device.

In recent years, electronic equipment has been developed to have a compact size, a light weight and a high function, and this has also required electronic components to have a compact size, a light weight and a high function. From this point of view, in regard to a method of forming a bump electrode on an IC electrode relevant to the present invention, a mounting method by means of a wire bonding technique is used.

The method of forming a bump electrode on an IC electrode by the aforementioned prior art wire bonding technique will be described below with reference to the drawings.

FIGS. 17A–17D show schematic views of a prior art bump electrode forming method. In the figure are shown an Au wire 101, an Au ball 102, a bonding capillary 103, an IC electrode 104 on a board 170, a ball bond portion 105 and a bump electrode 106.

The method of forming the bump electrode on the IC electrode will be described next.

In FIG. 17A, the Au ball 102 formed at the tip end of the Au wire 101 is supplied onto the IC electrode 104 as shown in FIG. 17B and bonded onto the IC electrode 104 by the bonding capillary 103. Subsequently, the bonding capillary 103 is moved upward, sideway and then downward, thereby connecting the Au wire to the ball bond portion 105 as shown in FIG. 17C. Subsequently, the capillary 103 is moved upward and the Au wire 101 is cut, thereby forming a bump electrode as shown in FIG. 17D.

The above operation will now be described in greater detail. A method of forming a bump on a semiconductor element by a prior art ball bonding method and a method of connecting the semiconductor element provided with the bump are disclosed in U.S. Pat. No. 4,661,192. The methods will be described.

As shown in FIG. 18A, a high voltage of several thousand volts is applied from a torch 160 which serves as a discharge electrode to the tip end 101a of a wire 101 protruding from the tip end 103a of a capillary 103. By the application of this high voltage, the wire 101 is increased in temperature and melted from the tip end 101a while a discharge current is flowing between the torch 160 and the wire tip end 101a, so that a ball-shaped melted portion as shown in FIG. 18B is formed. After the ball 102 is formed, the capillary 103 is moved down to the semiconductor element side, so that the ball 102 is made to abut against an electrode 104 of the semiconductor element 170. By further moving the capillary 103 downwardly with respect to the ball 102 that has abutted against the electrode 104, the ball 102 is bonded to the electrode 104 and the ball 102 is formed by the tip end portion 103a of the capillary 103, so that a bump base portion 8 as shown in FIG. 18C is formed. Next, as shown in FIG. 18D, by moving the capillary 103 upwardly away from the semiconductor element while clamping the wire 101 by means of the capillary 103, the wire 101 is torn off in the vicinity of the bump base portion 8, thereby forming a bump 30 on the electrode 104 of the semiconductor element 170. Consequently, a protruding portion 30a is formed upright on the bump base portion 8 of the bump 30 as shown in FIG. 18D.

In the semiconductor element 170 where the bump 30 is thus formed on the electrode 104, as shown in FIG. 19A, the bump 30 is pressed against a base material 21 on which a flat surface 21a is formed, so that a bump 31 having a flat surface 31a formed by flattening the protruding portion 30a is formed. Subsequently, as shown in FIG. 19B, the bump 31 having the flat surface 31a is brought in contact with a conductive adhesive 18 formed on a stage 41, thereby transferring the conductive adhesive 18 onto the flat surface 31a of the bump 31 and its periphery. Subsequently, as shown in FIG. 19C, by aligning in position the bump 31, onto which the conductive adhesive 18 has been transferred, with an electrode 20 on a circuit board 19 and thereafter making the bump 31 abut against the electrode 20, the bump 31 is bonded to the electrode 20 for the achievement of electrical connection between the semiconductor element 170 and the circuit board 19.

However, according to the bump electrode forming method as described above, the Au wire 101 comes in contact with the IC electrode portion 104 when the Au wire 101 is cut by the capillary 103. Consequently, as shown in FIG. 20A and 20B, the electrode 106a, 106b exhibits an abnormal shape and an IC electrode material adheres to the tip end of the Au wire 101, causing the issue that the Au ball 102a cannot be normally formed, as shown in FIG. 20C.

SUMMARY OF THE INVENTION

In view of the aforementioned issues, the present invention has an object to provide a method of forming a bump electrode on an IC electrode causing no abnormality in the shape of the electrode.

In accomplishing these and other objects, according to a first aspect of the present invention, there is provided a method of forming a bump electrode on an IC electrode comprising: forming a ball band portion on an IC electrode by a wire bonding apparatus; moving a bonding capillary upward (with respect to the IC electrode); moving the bonding capillary sideways and then downward; bonding a wire to the ball bond portion; and cutting the wire, the wire being prevented from coming in contact with a periphery of the ball bond portion (i.e. with portions around the ball bond portion) other than the ball bond portion itself by presetting a descent position of the bonding capillary to a position higher than a ball bond forming position.

According to a second aspect of the present invention, there is provided a method of forming a bump electrode on an IC electrode comprising: forming a ball bond portion on an IC electrode by a wire bonding apparatus; moving a bonding capillary upward; moving the bonding capillary sideways and then downward; bonding a wire to the ball bond portion; and cutting the wire, the wire being prevented from coming in contact with a periphery of the ball bond portion other than the ball bond portion itself by setting a chamfer angle of the bonding capillary not greater than 90 degrees to make the ball bond portion have a height greater than a diameter of the wire.

According to a third aspect of the present invention, there is provided a method of forming a bump electrode on an IC electrode comprising: forming a ball bond portion on an IC electrode by a wire bonding apparatus; moving a bonding capillary upward; moving the bonding capillary sideways and then downward; bonding a wire to the ball bond portion; and cutting the wire, the wire being prevented from coming in contact with a periphery of the ball bond portion other than the ball bond portion itself by setting a chamfer diameter of the bonding capillary greater than a diameter of the ball bond.

According to a fourth aspect of the present invention, there is provided a method of forming a bump electrode on an IC electrode comprising: forming a ball bond portion on an IC electrode by a wire bonding apparatus; moving a bonding capillary upward; moving the bonding capillary sideways and then downward; bonding a wire to the ball bond portion; and cutting the wire, the wire being prevented from coming in contact with a periphery of the ball bond portion other than the ball bond portion itself by making a tip end portion of an outer radius portion of the bonding capillary have a tapered thickness for concentration of a cutting force in a wire cutting stage.

According to a fifth aspect of the present invention, there is provided a method of forming a bump electrode on an IC electrode comprising: forming a ball bond portion on an IC electrode by a wire bonding apparatus; moving a bonding capillary upward; moving the bonding capillary sideways and then downward; bonding a wire to the ball bond portion; and cutting the wire, the wire being prevented from coming in contact with a periphery of the ball bond portion other than the ball bond portion itself by setting an angle so that an outer radius portion of the bonding capillary is brought in uniform contact with a slope of the ball bond portion.

According to a sixth aspect of the present invention, there is provided a method of forming a bump electrode on an IC electrode comprising: forming a ball bond portion on an IC electrode by a wire bonding apparatus; moving a bonding capillary upward; moving the bonding capillary sideways and then downward; bonding a wire to the ball bond portion; and cutting the wire, the wire being prevented from coming in contact with a periphery of the ball bond portion other than the ball band portion itself by bringing the bonding capillary in contact with the wire above a center portion of the ball bond portion.

According to a seventh aspect of the present invention, there is provided a semiconductor element in which the one bump electrode having two protrusions is bonded to the IC electrode on a circuit forming surface of a semiconductor element by the method defined in any one of the first to sixth aspects, and said two protrusions are brought in contact with or put close to one electrode on a circuit board when the semiconductor element is mounted on the circuit board.

According to an eighth aspect of the present invention, there is provided a semiconductor element in which the bump electrode is bonded to the IC electrode an a circuit forming surface of a semiconductor element by the method defined in any one of the first to sixth aspects, said bump electrode comprising: a first protrusion which is comprised of a portion formed by once melting and solidifying a wire and its periphery and is bonded to said electrode; and a second protrusion which is formed of an unmelted portion of said wire and extends from said first protrusion beyond a planar area defined by projecting said first protrusion on said electrode to a height approximately equal to that of said first protrusion with respect to said electrode, and said first protrusion and said second protrusion being brought into contact with or put close to one electrode on said circuit board when the semiconductor element is mounted on the circuit board.

According to a ninth aspect of the present invention, there is provided a semiconductor element as defined in the eighth aspect, wherein said first protrusion is provided with a formed portion formed by forming a melted portion of said wire by a capillary and solidifying the same and a wire material portion which is comprised of the wire in a vicinity of said melted portion, extends from a vertex portion of said formed portion downwardly of said vertex portion and bonded to said formed portion.

According to a tenth aspect of the present invention, there is provided a semiconductor element as defined in the eighth or ninth aspect, wherein said formed portion has a base portion bonded to said electrode and a protruding portion provided upright on said base portion.

According to an eleventh aspect of the present invention, there is provided a semiconductor element as defined in the ninth aspect, wherein said wire material portion extending downwardly from said vertex portion is bonded to said electrode, instead of said formed portion.

According to a twelfth aspect of the present invention, there is provided a semiconductor element as defined in any of the eighth through eleventh aspects, wherein said second protrusion extends toward an outer end surface side of said semiconductor element without extending beyond said outer end surface.

According to a thirteenth aspect of the present invention, there is provided a semiconductor element as defined in any of the eighth through eleventh aspects, wherein said second protrusion extends outwardly of said semiconductor element beyond an outer end surface of said semiconductor element.

According to a fourteenth aspect of the present invention, there is provided a semiconductor element as defined in any of the eighth through thirteenth aspects, wherein said first protrusion and said second protrusion have respective flat surface portions at the vertex portions of the protrusions.

According to a fifteenth aspect of the present invention, there is provided a semiconductor device in which an electrode on a circuit board and said bump electrode of the semiconductor element as defined in any of the seventh through fourteenth aspects are electrically connected to each other.

According to a sixteenth aspect of the present invention, there is provided a method of fabricating a semiconductor element in which the bump electrode is bonded to the IC electrode on a circuit forming surface of a semiconductor substrate by the method defined in any one of the first to sixth aspects, comprising: forming a first protrusion which is comprised of a portion formed by solidifying a melted portion of a wire and its periphery and is bonded to said electrode; and forming a second protrusion which is formed of an unmelted portion of said wire and extends from said first protrusion beyond a planar area defined by projecting said first protrusion on said electrode to a height approximately equal to that of said first protrusion with respect to said electrode, whereby said first protrusion and said second protrusion are brought into contact with or put close to one electrode on a circuit board when the semiconductor element is mounted on the circuit board.

According to a seventeenth aspect of the present invention, there is provided a method of fabricating a semiconductor element as defined in the sixteenth aspect, wherein said first protrusion is formed by forming the melted portion of said wire into a formed portion by said capillary and extending the wire in a vicinity of said melted portion from a vertex portion of said formed portion downwardly of the vertex portion and bonding the wire to said formed portion, consequently forming a wire material portion.

According to an eighteenth aspect of the present invention, there is provided a method of fabricating a semiconductor element as defined in the seventeenth aspect, wherein said wire material portion instead of said formed portion is bonded to said electrode when said wire material portion is formed.

According to a nineteenth aspect of the present invention, there is provided a method of fabricating a semiconductor element as defined in the seventeenth or eighteenth aspect, wherein, after the formation of said formed portion, said wire continuous to said formed portion is bonded after said capillary describes an approximately rectangular shape in a plane parallel to a vertical direction above said formed portion when said first protrusion is formed.

According to a 20th aspect of the present invention, there is provided a method of fabricating a semiconductor element as defined in any of the sixteenth through nineteenth aspects, wherein a region of said wire recrystallized by heat has a length extending to an end of said second protrusion when said melted portion is formed.

According to a 21st aspect of the present invention, there is provided a method of fabricating a semiconductor element as defined in the 20th aspect, wherein the length of said recrystallized region is controlled by an application time of a voltage to be applied to said wire for the formation of said melted portion.

According to a 22nd aspect of the present invention, there is provided a method of fabricating a semiconductor element as defined in any of the 16th through 21st aspects, wherein an end portion of said second protrusion extends to the peripheral side of said semiconductor element when said second protrusion is formed.

According to a 23rd aspect of the present invention, there is provided a method of fabricating a semiconductor element as defined in any of the 16th through 21st aspects, wherein an end portion of said second protrusion extends beyond the periphery of said semiconductor substrate to the outside of said semiconductor substrate when said second protrusion is formed.

According to a 24th aspect of the present invention, there is provided a method of fabricating a semiconductor element as defined in any of the 16th through 23rd aspects, wherein after the bump electrode having said first protrusion and second protrusion is formed, a flat surface portion is formed at a vertex portion of each of said first protrusion and second protrusion.

According to a 25th aspect of the present invention, there is provided a method of fabricating a semiconductor device comprising: fabricating a semiconductor element by the fabricating method of any of the 26th through 24th aspects; providing a conductive adhesive at each of said first protrusion and said second protrusion; and electrically connecting said bump electrode of the semiconductor element to an electrode on the circuit board.

According to a 26th aspect of the present invention, there is provided a method of fabricating a semiconductor device comprising: fabricating a semiconductor element by the fabricating method as defined in the 23rd aspect; providing a conductive adhesive at the vertex portions of each of said first protrusion and said second protrusion; electrically connecting said bump electrode of the semiconductor element to an electrode on the circuit board; and checking the performance of electrical connection between said bump and said electrode using a good-or-bad test by picking up an image of an outwardly protruding portion extending outwardly of said semiconductor element beyond the periphery of said semiconductor substrate by means of an image pick-up device.

According to a 27th aspect of the present invention, there is provided a method of fabricating a semiconductor device as defined in the 26th aspect, wherein said good-or-bad test of said electrical connection is executed by determining the presence or absence of the conductive adhesive based on pick-up image information of said outwardly protruding portion picked up by said image pick-up device.

According to a 28th aspect of the present invention, there is provided a method of fabricating a semiconductor device as defined in the 26th aspect, wherein said good-or-bad test of said electrical connection is executed by confirming the operation of said semiconductor element by electrically bringing a contact into contact with said outwardly protruding portion instead of using said image pick-up device.

According to a 29th aspect of the present invention, there is provided a method of fabricating a semiconductor device as defined in the 28th aspect, wherein confirmation of operation of said semiconductor element is executed by a diode characteristic test.

According to a 30th aspect of the present invention, there is provided a method of fabricating a semiconductor device as defined in any of the 25th through 29th aspects, wherein a flat surface portion is formed at the vertex portion of each of said first protrusion and said second protrusion before said conductive adhesive is provided, and then said conductive adhesive is provided on the flat surface portion.

According to a 31st aspect of the present invention, there is provided a method of fabricating a semiconductor device as defined in any of the 25th through 30th aspects, wherein solder is used in place of said conductive adhesive.

With the above-mentioned arrangement of the present invention, the wire does not come in contact with the periphery of the ball bond portion other than the ball bond portion itself when the wire is bonded to the ball bond portion, so that a bump electrode can be formed on the IC electrode.

BRIEF DESCRIPTION OF THE DRAWINGS

These and other aspects and features of the present invention will become clear from the following description taken in conjunction with the preferred embodiments thereof with reference to the accompanying drawings, in which:

FIG. 1D is a sectional view showing the method of forming the bump electrode on the IC electrode according to the embodiment of the present invention;

FIG. 3B is a time chart for explaining the operation of the embodiment;

FIGS. 18A, 18B, 18C, and 18D are views for explaining the operation of forming a prior art bump;

DETAILED DESCRIPTION OF THE PREFERRED EMBODIMENTS

Figure 1A:
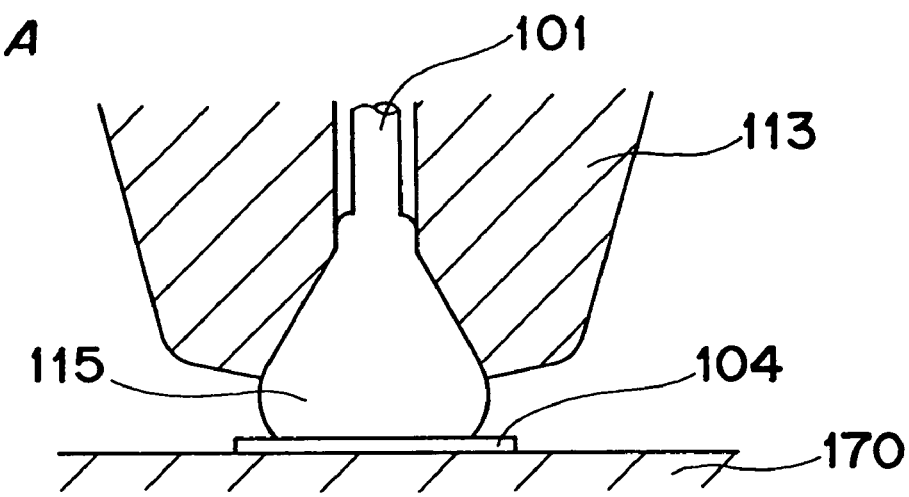
FIGS. 1A, 1B, and 1C are sectional views showing a method of forming a bump electrode an an IC electrode according to an embodiment of the present invention.

Before the description of the present invention proceeds, it is to be noted that like parts are designated by like reference numerals throughout the accompanying drawings.

First, before preferred embodiments of the present invention are described, schematic aspects of the present invention are briefly described below.

According to an aspect of the present invention, there is provided a bump electrode forming method comprising: forming a ball bond portion on an IC electrode by a wire bonding apparatus (e.g. a capillary driving device); moving a bonding capillary upwardly; moving the bonding capillary sideways and then downward; bonding an Au wire to a ball bond portion; and cutting the Au wire, the Au wire being prevented from coming in contact with the periphery of the ball bond portion (i.e. portions around the ball bond portion) other than the ball bond portion itself by presetting a descent position of the bonding capillary to a position higher than a ball bond forming position. With this arrangement, the Au wire can be prevented from coming in contact with the IC electrode portion as pressed by the capillary when the Au wire is cut by the capillary.

According to an aspect of the present invention, there is provided a bump electrode forming method comprising: forming a ball bond portion on an IC electrode by the wire bonding apparatus; moving a bonding capillary upward with respect to the IC electrode; moving the bonding capillary sideways and then downward with respect to the IC electrode; bonding an Au wire to a ball bond portion; and cutting the Au wire, the Au wire being prevented from coming in contact with the periphery of the ball bond portion (i.e. portions around the ball bond portion) other than the ball bond portion by setting a chamfer angle of the bonding capillary not greater than 90 degrees to make the ball bond portion have a height greater than the diameter of the Au wire. With this arrangement, the height of the ball bond portion is set high, so that the Au wire can be prevented from coming in contact with the electrode portion when the Au wire is cut by the bonding capillary.

According to another aspect of the present invention, there is provided a bump electrode forming method comprising: forming a ball bond portion on an IC electrode by the wire bonding apparatus; moving a bonding capillary upward with respect to the IC electrode; moving the bonding capillary sideways and then downward with respect to the IC electrode; bonding an Au wire to a ball bond portion; and cutting the Au wire, the Au wire being prevented from coming in contact with the periphery of the ball bond portion other than the ball bond portion by setting a chamfer diameter of the bonding capillary greater than the diameter of the ball bond portion. With this arrangement, the bonded state of the Au wire is stabilized, so that the Au wire can be prevented from coming in contact with the electrode portion when the Au wire is cut by the bonding capillary.

According to a further aspect of the present invention, there is provided a bump electrode forming method comprising: forming a ball bond portion on an IC electrode by the wire bonding apparatus; moving a bonding capillary upward with respect to the IC electrode; moving the bonding capillary sideways and then downward with respect to the IC electrode; bonding an Au wire to a ball bond portion; and cutting the Au wire, the Au wire being prevented from coming in contact with the periphery of the ball bond portion other than the ball bond portion by making a tip end portion of an outer radius portion of the bonding capillary have a tapered thickness for concentration of a cutting force in an Au wire cutting stage. With this arrangement, the Au wire is cut by a small cutting force, so that the Au wire can be prevented from coming in contact with the electrode portion in the cutting stage.

According to yet another aspect of the present invention there is provided a bump electrode forming method comprising: forming a ball bond portion on an IC electrode by the wire bonding apparatus; moving a bonding capillary upward with respect to the IC electrode; moving the bonding capillary sideways and then downward with respect to the IC electrode; bonding an Au wire to a ball bond portion; and cutting the Au wire, the Au wire being prevented from coming in contact with the periphery of the ball bond portion other than the ball bond portion by setting an angle so that an outer radius portion of the bonding capillary is brought in uniform contact with a slope of the ball bond portion. With this arrangement, the effect of bringing the bonding capillary into contact with the Au wire is improved, so that the Au wire can be cut in a stabilized state.

According to yet another aspect of the present invention, there is provided a bump electrode forming method comprising: forming a ball bond portion on an IC electrode by the wire bonding apparatus; moving a bonding capillary upward with respect to the IC electrode; moving the bonding capillary sideways and then downward with respect to the IC electrode; bonding an Au wire to a ball bond portion; and cutting the Au wire, the Au wire being prevented from coming in contact with the periphery of the ball bond portion other than the ball bond portion by bringing the bonding capillary in contact with the Au wire above a center portion of the ball bond portion. With this arrangement, the bonding capillary can bond and cut the Au wire in a stabilized state.

Preferred embodiments of the present invention will be described below with reference to FIGS. 1 and 2.

FIRST EMBODIMENT

Figure 1B:
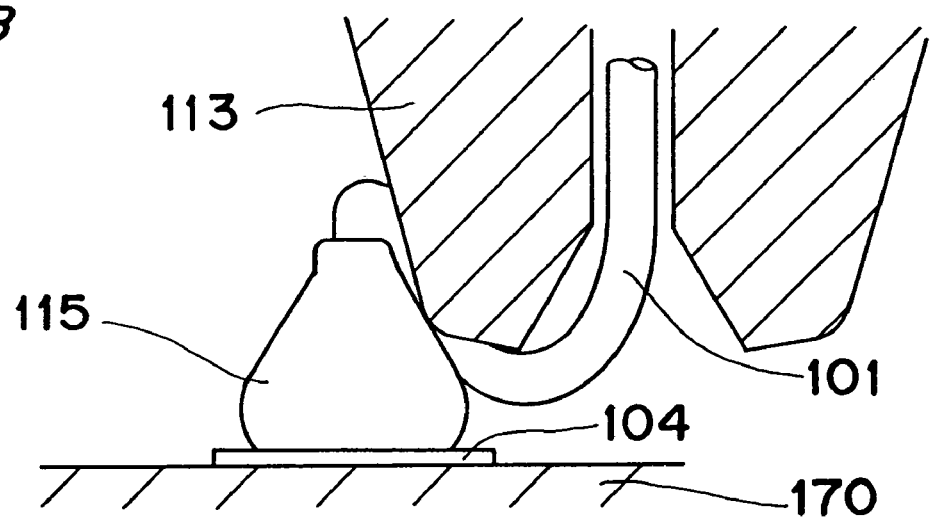
Figure 1C:
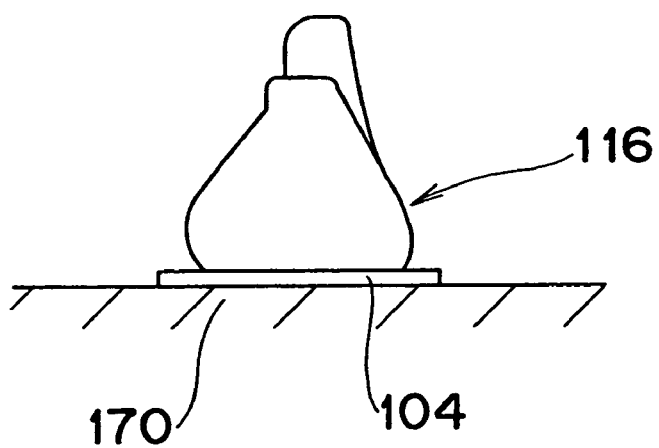

FIGS. 1A–1C show sectional views of processes of a bump electrode forming method according to a first embodiment of the present invention, where an Au wire 101 is prevented from coming in contact with any portion other than the ball bond portion 115 when the Au wire 101 is bonded to the ball bond portion 115.

In FIGS. 1A–1C are shown the Au wire 101 as one example of a wire, a bonding capillary 113, an IC electrode 104 and the ball bond portion 115.

The operation of the method of forming a bump electrode on the IC electrode will be described next with reference to FIGS. 1A–1C and 2.

FIG. 1A is a sectional view showing when the ball bond portion 115 is formed on the IC electrode 104 of the board 170, FIG. 1B is a sectional view showing a state in which the Au wire 101 is bonded to the ball bond portion 115 by the bonding capillary 113 located in a descent position, and FIG. 1C is a sectional view of a bump electrode 116.

Figure 2:
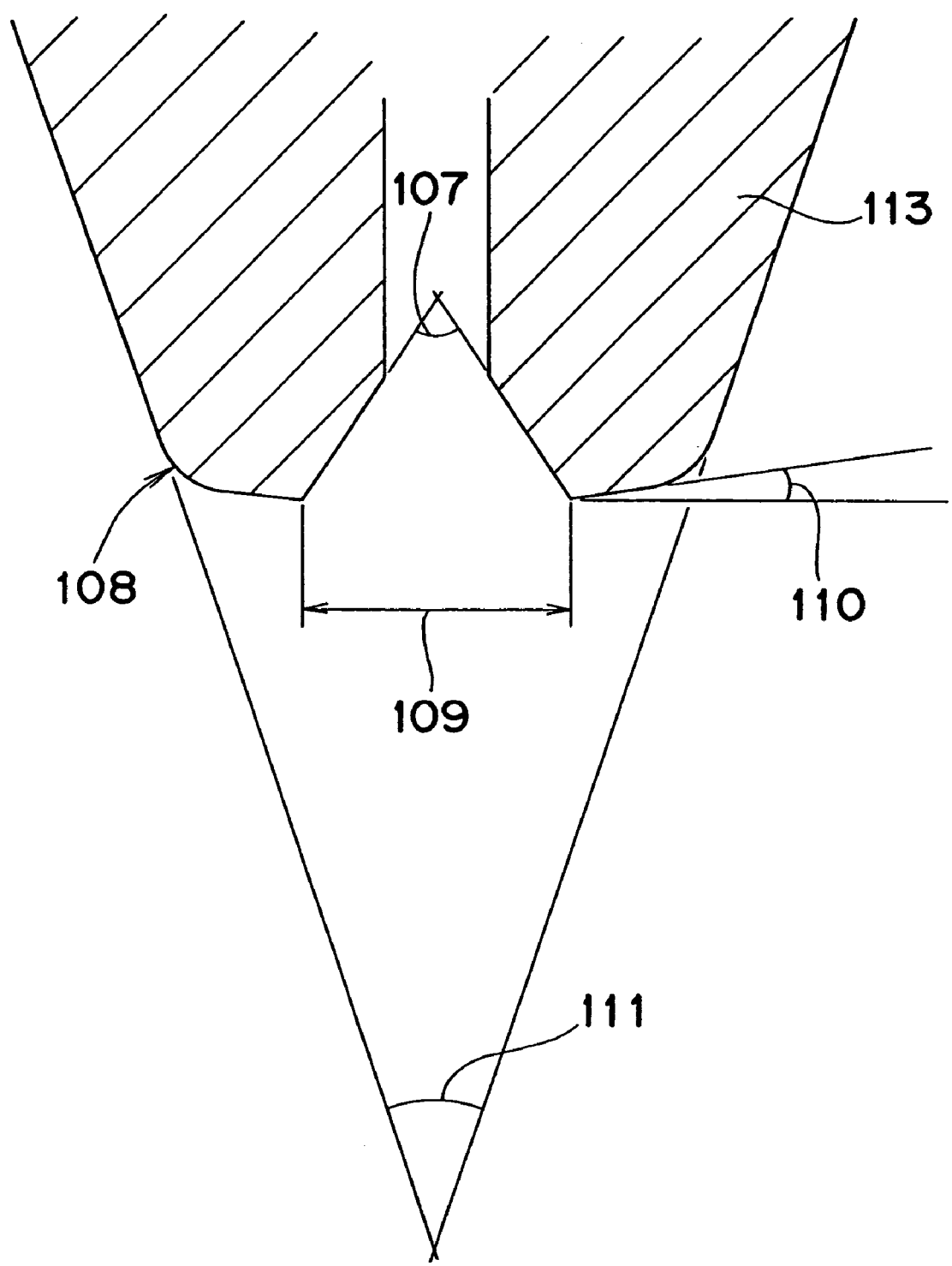
FIG. 2 is a sectional view of a bonding capillary in the embodiment.

FIG. 2 is a sectional view of the bonding capillary 113, in which are shown a chamfer angle 107, an outer radius 108, a chamfer diameter 109, a face angle 110 and a cone angle 111.

Figure 3A:
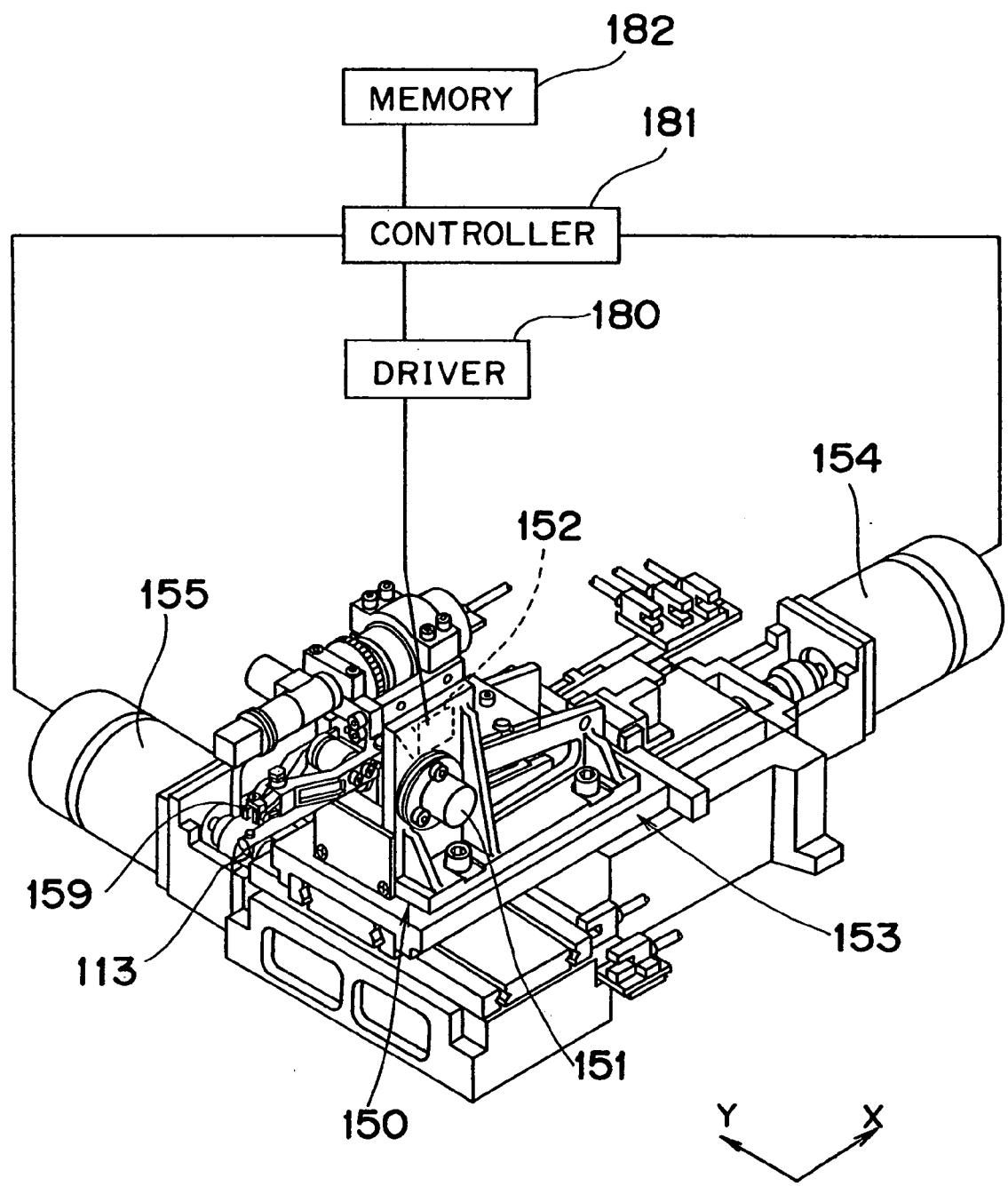
FIG. 3A is a perspective view of a capillary driving device of the embodiment.

First, the position in height of the bonding capillary 113 in a ball bond forming stage is stored in the apparatus in FIG. 3A, and the position in height of the bonding capillary 113 when the bonding capillary 113 is moved down to bond the Au wire 101 to the ball bond portion 115 is preparatorily set to a position higher than the position in the ball bonding stage.

As shown in FIG. 3A, the capillary 113 is driven by a supersonic generating device 152 such as a voice coil in a capillary driving device 150 to minutely move up and down around a fulcrum 151. The capillary driving device 150 is set on an X-Y table 153 which is driven in X and Y directions by motors 154 and 155. The operations of the motors 154 and 155 and a driver 180 for driving the supersonic generating device 152 are controlled by a controller 181.

The operation of the embodiment described above will be described with the reference to FIGS. 3A and 3B based on the ball bonding method. An ordinate axis of FIG. 3B shows movement (height) in the Z direction perpendicular to the X and Y directions and an abscissa axis thereof shows time of the operation of the embodiment.

It is noted that the ball bonding method is also described in detail in a seventh embodiment described below. In FIG. 3B, first, the controller 181 controls the motors 154 and 155 so that the capillary 113 is moved to a torch 160 to form a ball at the lower end of the wire 101. Then, the capillary 113 is moved to a first wire coordinate (X,Y,Z) as a reference position for forming a bump electrode 116 (bump) on the electrode 104 of the board 170 by control of the controller 181 based on the data stored in a memory 182 of the controller 181. The first wire coordinate is located just above the position of the electrode 104 in the Z direction. At this time, a clamp 159 for clamping the wire 101 set above the capillary 113 in the capillary driving device 150 is open so as to not clamp the wire 101. Then, the driver 180 of the supersonic generating device 152 is controlled by the controller 181 so that the capillary 113 is moved down toward the electrode 104 at a first step (1) of FIG. 3B by the supersonic generating device 152. When the capillary 113 has been moved down by a predetermined distance stored in the memory 182, the descending speed of the capillary 113 is lowered to prevent the capillary 113 from contacting the electrode 104 with such a large force that damages it. That is, the capillary 113 is slowly moved down at a second step (2) toward the electrode 104. When the capillary 113 contacts the electrode 104, the capillary 113 continues to descend until the driver 180 detects a predetermined load from the capillary 113 by detecting a current running through the driver 180, and after the load detection, the driver 180 sends a first contact signal to the controller 181. Based on the reception of the first contact signal, the controller 181 controls the driver 180 to apply supersonic vibration to the capillary 113 with a first load to form a ball bond portion 115 on the electrode 104 as shown in FIG. 1A at a third step (3). Then, after the formation of the ball bond portion 115, the capillary 113 is moved up at a higher speed than the descending speeds of the second and third steps (2) and (3), at a fourth step (4).

Then, at the start of a fifth step (5), the clamp 159 starts to clamps the wire 101 and continues to clamp it during a predetermined period of time. The capillary 113 is looped and moved down as shown in FIG. 5D at the fifth step (5) while the wire 101 is clamped by the clamp 159 for the period of time and after the period of time the wire 101 is free from clamping.

If necessary, correction of the movement amount(s) is performed by the controller 181 depending on the shape of the ball portion 115 or the like at a sixth step (6).

Then, at a seventh step (7) of searching the slope of the ball bond portion 115, the capillary 113 is further moved down at a lower speed to prevent the capillary 113 from contacting the slope of the ball portion 115 with such a large force that damages it. At that time, as described above, the lowest position in height of the capillary 113 when the capillary 113 is moved down to bond the wire 101 to the slope of the ball bond portion 115 is preparatorily set to the position higher than the lowest position in the ball bonding stage. Accordingly, based on the preparatorily set position of the capillary 113, the movement amount of the capillary 113 in the Z direction is previously determined and stored in the memory 182. Thus, based on the stored position and movement amount data, the controller 181 controls the supersonic generating device 152 to move the capillary 113 downward at the lower speed in order to bond the wire 101 to the slope of the ball bond portion 115, the movement amounts of the capillary 113 in the X and Y directions from the center of the ball portion 115 are also previously determined and stored in the memory 182 such that the bonding wire can be bonded to the ball bond portion with no space circumscribed by the bonding wire (see FIGS. 1B and 1C). Thus, based on the stored position and movement amount data, the controller 181 controls the motors 154 and 155. When the capillary 113 contacts the slope of the ball portion 115, the capillary 113 continues to descend until the driver 180 detects a predetermined load from the capillary 113 by detecting a current running through the driver 180. After the detection, the driver 180 sends a second contact signal to the controller 181. Based on the reception of the second contact signal, the controller 181 controls the driver 180 to apply supersonic vibration to the capillary 113 with a second load to connect the wire 101 to the slope of the ball bond portion 115 as shown in FIG. 1B at an eighth step (8). After the connection of the wire 101 to the slope of the ball bond portion 115, the capillary 113 is moved up while the clamp 159 does not clamp the wire 101 at a ninth step (9). After the ninth step (9) is completed and the clamp 159 clamps the wire 101 again, the capillary 113 is moved upward to break the wire 101 and moved to a next coordinate (X,Y,Z) above the next electrode 104 at a tenth step (10). Then, at an eleventh step (11), another ball is formed at the lower end of the wire 101 by the torch 160. Then, the first to eleventh steps (1) through (11) are repeated on or above the next electrode 104.

By thus presetting the descent position of the bonding capillary 113 to a position higher than the position in the ball bonding stage, the Au wire 101 can be prevented from coming in contact with the IC electrode portion 104 even when the Au wire 101 is pressed by the capillary 113 when the Au wire 101 is cut by the capillary 113.

SECOND EMBODIMENT

As shown in FIG. 2, by setting the chamfer angle 107 of the bonding capillary 113 to an angle of not greater than 90 degrees, the height of the ball bond portion 115 is made greater than the diameter of the Au wire 101.

By thus setting high the ball bond portion 115, the Au wire 101 can be prevented from coming in contact with the electrode portion 104 when the Au wire 101 is cut by the bonding capillary 113.

THIRD EMBODIMENT

As shown in FIG. 2, by making the chamfer diameter 109 of the bonding capillary 113 greater than the ball bond portion diameter, the ball bond portion 115 can be prevented from spreading outwardly in the ball bonding stage, thereby allowing the bonded state of the Au wire 101 to be stabilized. By thus stabilizing the bonded state of the Au wire 101, the Au wire 101 can be prevented from coming in contact with the electrode portion 104 when the Au wire 101 is cut by the bonding capillary 113.

FOURTH EMBODIMENT

As shown in FIG. 2, by setting the thickness of the tip end portion of the outer radius portion 108 of the bonding capillary 113 to, for example, 10 μm or smaller and making it have a tapered shape, the cutting force can be concentrated on the tip end of the outer radius portion 108 in cutting the Au wire 101. Since the Au wire 101 is cut by a small cutting force as described above, the Au wire 101 can be prevented from coming in contact with the electrode portion 104 in the cutting stage.

FIFTH EMBODIMENT

As shown in FIG. 1B, by setting the angle of the outer radius portion so that the outer radius portion of the bonding capillary 113 comes in uniform contact with the slope of the ball bond portion 115, the effect of bringing the bonding capillary 113 in contact with the Au wire 101 is improved, so that the Au wire 101 can be stably cut.

SIXTH EMBODIMENT

Figure 13:
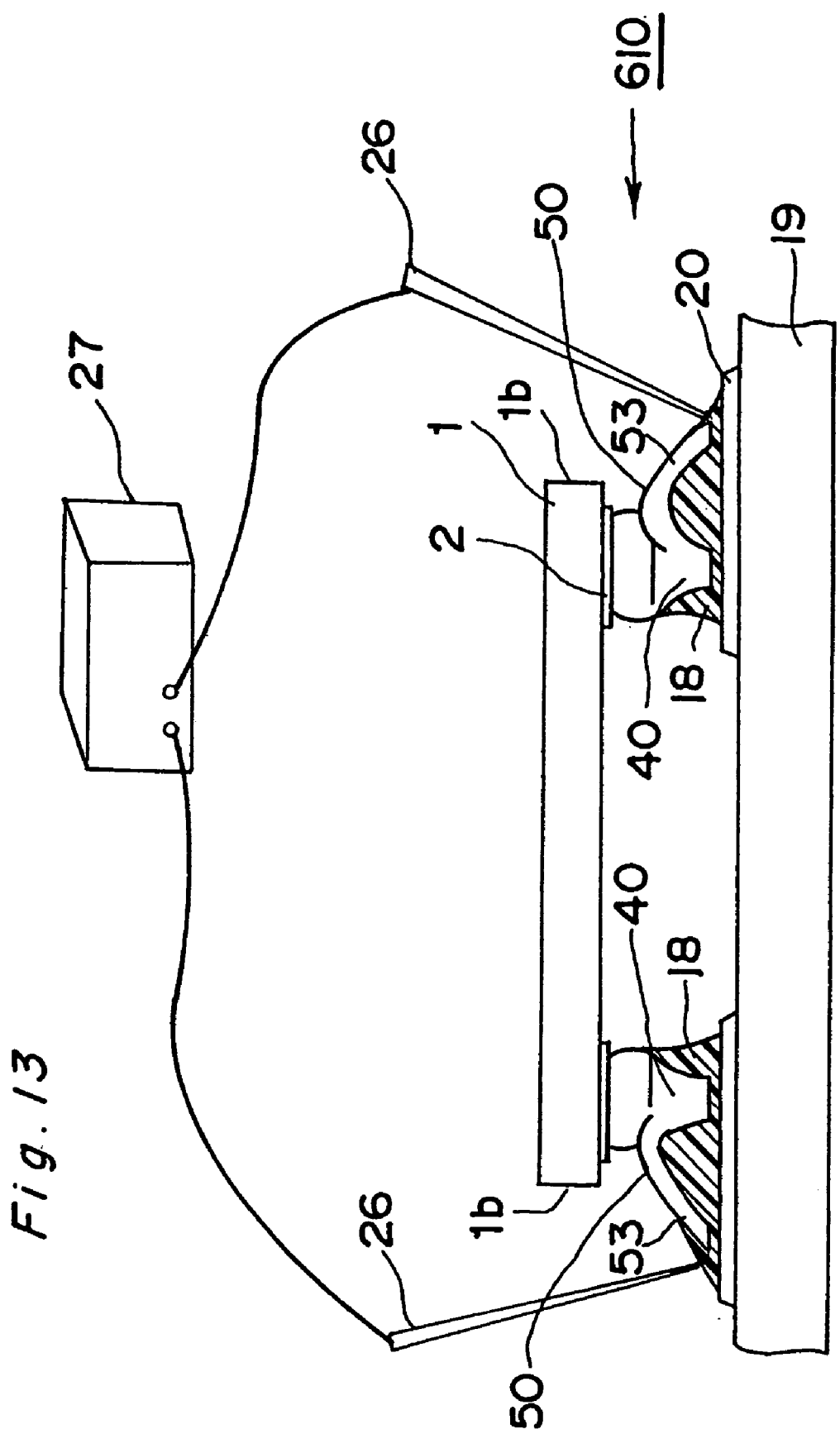
FIG. 13 is a view showing another example of the method of testing a semiconductor device fabricated with a semiconductor element having the bumps shown in FIG. 10.

As shown in FIG. 13, by bringing the bonding capillary 113 in contact with the Au wire 101 above the center portion of the slope of the ball bond portion 115, the Au wire 101 can be bonded and cut in a stabilized state even when the Au wire contact is varied.

With reference to FIG. 1D, the preset descent position of the bonding capillary 113 to the position higher than the ball bond forming position is determined as one example as follows. In FIG. 1D, in order to prevent a lowest point D of the curved portion of the wire 101 from coming into contact with the electrode 104, a point C where the outer radius portion 108 of the capillary 113 contacts the slope of the bump bond portion 115 should be maintained at a height of the sum of [(the outer diameter of the wire 101)+α] from the surface of the electrode 104, where α is a constant. When the point C is set at the center of the slope of the bump bond portion 115, the height (μm) of the point C from the electrode 104 is actually found by an expression: $C=-0.1*\theta+34$, where θ is a vertex angle (degree) of the bump bond portion 115 (=the chamfer angle 107 of the bonding capillary 113). For example, when θ is 0°, C is 34; when θ is 70°, C is 27; when θ is 80°, C is 26; and when θ is 180°, C is 16. When α=5 μm, it is preferable to satisfy an expression: $\theta \leq 90°$. Actually, when the point C is set at the center of the slope of the bump bond portion 115, a distance B between the center of the bump bond portion 115 and the center of the capillary 113 contacted on the slope of the bump bond portion 115 should satisfy an expression: $B=0.5*A+40$, where a distance A is a width of the bump bond portion 115. A relationship between the distance A and an outer diameter F of the ball 101a of the wire 101 should satisfy an expression: F (μm)=A (μm)−13 (μm). As an actual example, when θ which is a vertex angle (degree) of the bump bond portion 115 (=the chamfer angle 107 of the bonding capillary 113) ranges from 60° to 90° and the outer diameter of the wire 101 is 25 μm, the distance A of the bump bond portion 115 is 80±5 μm, the distance B between the centers of the bump bond portion 115 and the capillary 113 is 80±2 μm, and the height of the point C is 80±10 μm.

Although the material of Au is used as a bump electrode material in the aforementioned embodiments, the bump electrode material is not limited to Au, and the same effect can be produced in the case of another metal.

As described above, by using each of the aforementioned methods, the method of forming a bump electrode on an IC electrode, comprises forming a ball bond portion on an IC electrode by a wire bonding technique; moving a bonding capillary upward; moving the bonding capillary sideways and then downward; bonding an Au wire to a ball bond portion; and cutting the Au wire. By this method, the Au wire does not come in contact with portions around the ball bond portion other than the ball bond portion itself. This arrangement prevents the Au wire bonding conditions caused by the contact of the Au wire with a portion other than the ball bond portion, such as an electrode portion from becoming unstable and prevent the possible occurrence of an abnormal shape of the bump electrode caused by the adhesion of the IC electrode material to the Au wire, thereby allowing a bump electrode to be formed on an IC electrode with high quality and high accuracy.

SEVENTH EMBODIMENT

A semiconductor element according to a seventh embodiment of the present invention, a semiconductor device employing the semiconductor element as well as a method of fabricating the semiconductor element and a method of fabricating the semiconductor device will be described below with reference to the drawings. It is to be noted that the same constituent members are denoted by the same reference numerals in each figure.

The above-mentioned semiconductor element will be described first.

Figure 4:
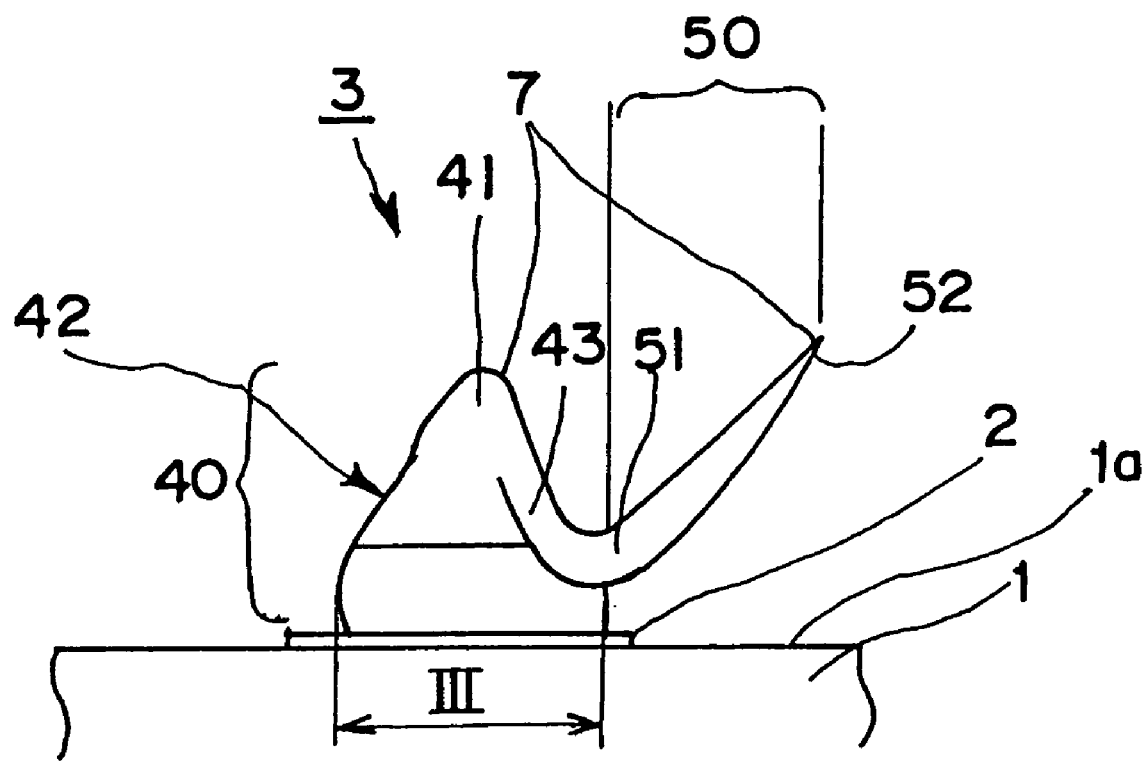
FIG. 4 is a side view showing an example of the shape of a bump formed on a semiconductor element according to a seventh embodiment of the present invention.
Figure 15:
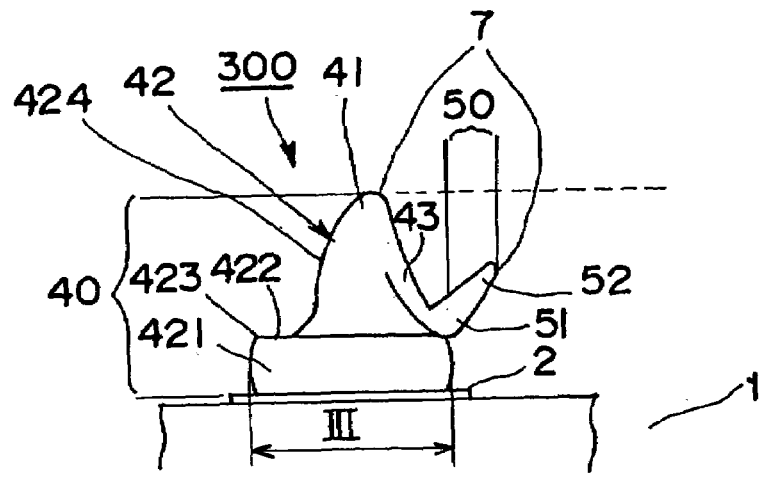
FIG. 15 is a view showing the case where the other end of the second protrusion is not extended to the height of the first protrusion in the bump shown in FIG. 7.

One bump is bonded onto each electrode 2 on a circuit forming surface 1a of a semiconductor element 1. In the semiconductor element 1 of the seventh embodiment, a bump 3 having two protruding portions, including a first protrusion 40 and a second protrusion 50, is bonded to at least one electrode 2 as shown in FIG. 4. It is to be noted that this kind of bump 3 is preferably provided on all the electrodes 2 of the semiconductor element 1. The second protrusion 50 extends beyond a planar area III defined by projecting the first protrusion 40 on the electrode 2, and one end 52 (which is a terminal end portion of the second protrusion 50) extends from the other end 51 to a height approximately equal to that of the vertex portion 41 of the first protrusion 40 in the direction of height from the electrode 2. It is to be noted that FIG. 4 shows the case where the terminal end 52 extends to a position located slightly higher than the height of the vertex portion 41 of the first protrusion 40. FIG. 15 shows the case where the terminal end 52 extends in height to a position located approximately halfway between the position in height of the end 51 and the position in height of the vertex portion 41 of the first protrusion 40.

The terminal end 52 of the second protrusion 50 comes in contact with no adjacent electrode 2 of the semiconductor element 1.

By thus providing the first protrusion 40 and the second protrusion 50 at one bump 3, the area of the vertex portions 7 of the bump 3 can be increased, and as described in detail later, the connection area when connecting the above-mentioned bump 3 to the electrode of the circuit board by means of a conductive adhesive can be increased, so that the connection resistance value can be reduced. Furthermore, the amount of transfer of the conductive adhesive onto the bump 3 can be increased, and this eliminates the possible occurrence of a defective electrical connection, allowing the conduction reliability to be improved.

Figure 6:
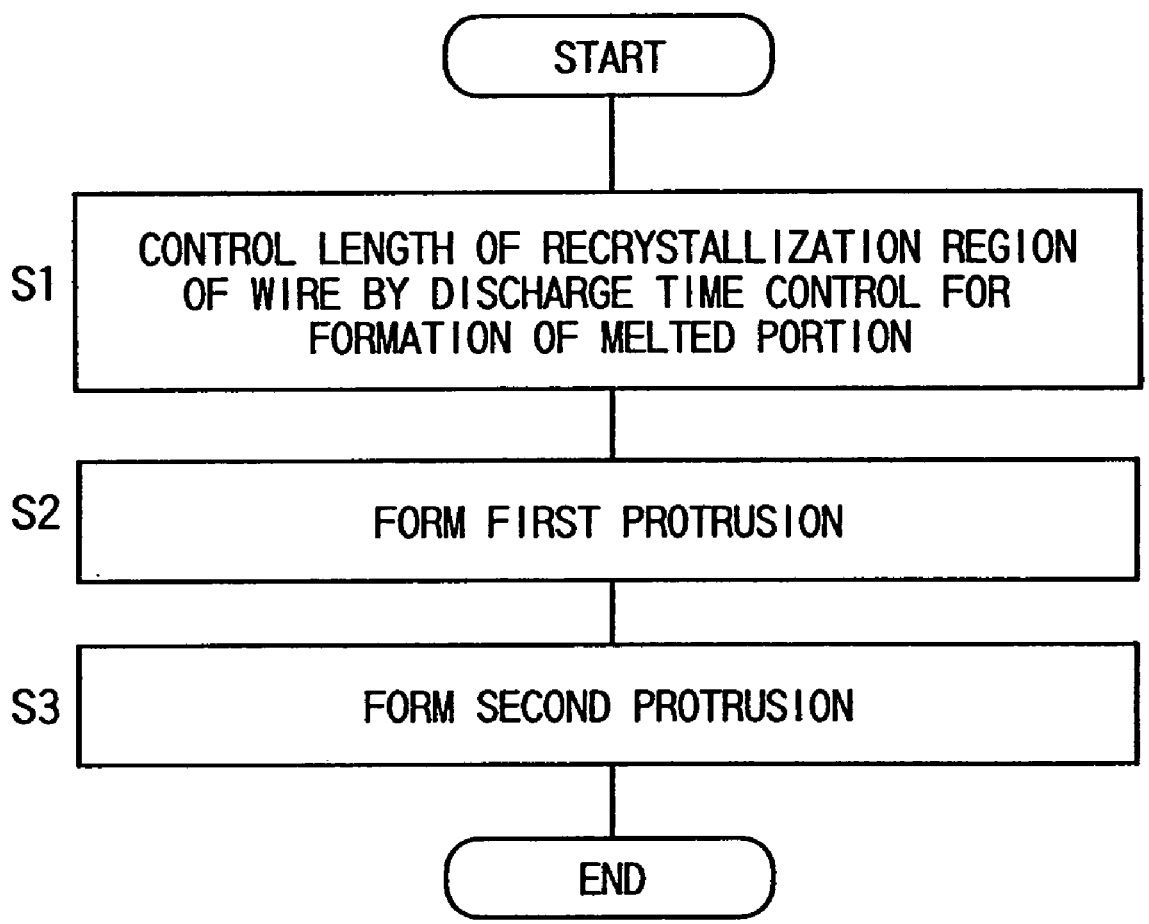
FIG. 6 is a flowchart of a fabricating process of a bump provided for a semiconductor element according to an eighth embodiment of the present invention.

The bump 3 of the above-mentioned type is formed approximately through the processes in Steps (each indicated by "S"in the figure) 1 through 3 as shown in FIG. 6, mostly in accordance with the ball bonding method. That is, in Step 1, the length of a recrystallization region as described later is controlled by controlling the discharge time, thereby melting the wire 10. In Step 2, the first protrusion 40 is formed of the melted wire on the electrode 2. In Step 3, the second protrusion 50 is further formed. These operations will be described in more detail below.

Figure 5A:
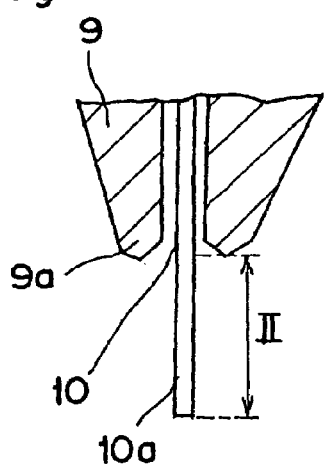
FIGS. 5A, 5B, 5C, 5D, 5E, and 5F are views for explaining the operation of forming the bump as shown in FIG. 7.

As shown in FIG. 5A, a wire 10 which has a wire diameter of, for example, 25 μm and is made of a material of, for example, gold is extended by about a length II from the tip end portion 9a of the capillary 9. It is to be noted that the above-mentioned length II is 450 μm, i.e., the projection length in the prior art. The material of the wire 10 is not limited to the above-mentioned gold, and it may be provided by copper, aluminum, nickel, solder or the like so long as the ball bonding method can be effected. Depending on the diameter of the wire 10, bump dimensions such as a base diameter and a height can be changed according to the purpose.

Figure 5B:
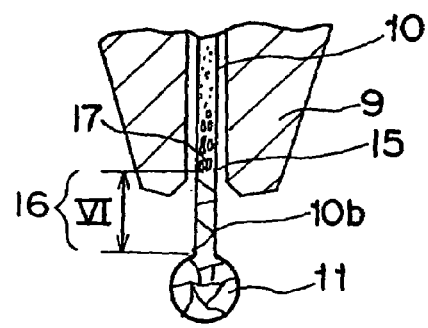

A high voltage is applied to the tip end portion 10a of the wire 10 similarly to the prior art, and as shown in FIG. 5B, the tip end portion 10a is melted by an electric discharge between a discharge electrode and the tip end portion 10a, thereby forming a ball 11. It is to be noted that the diameter of the ball 11 can be controlled by the value of the application voltage, and the diameter of the ball 11 increases as the application voltage is increased. In the ball 11 and a certain length of the wire 10 continuous to the ball 11, the crystal grain of the wire 10 is increased by heat generated by the above-mentioned electric discharge. This portion having the great crystal grain serves as a recrystallized region 16, and its length VI becomes 120 μm when the discharge time is 5 ms. For the reason that the crystal grain size differs in a boundary portion between a normal crystal region 17 having the initial crystal grain size and the above-mentioned recrystallized region 16, there is formed a crystal grain interface 15 at which the breaking strength of the wire 10 is weak. For the reason that the other end 52 of the second protrusion 50 is located at the crystal grain interface 15 or its vicinity, the length VI of the recrystallized region 16 becomes an important factor for the formation of the second protrusion 50. The length VI of the recrystallized region 16 as described above can be controlled by the discharge time in which the electric discharge is effected.

Figure 5C:
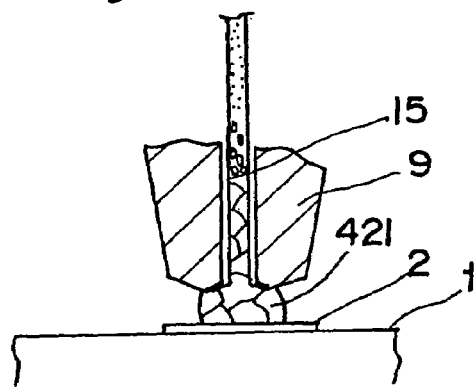
Figure 5D:
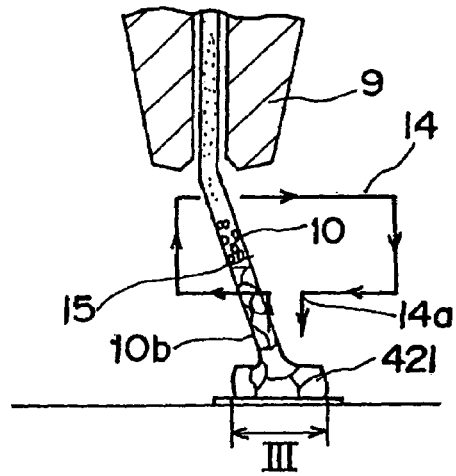
Figure 7:
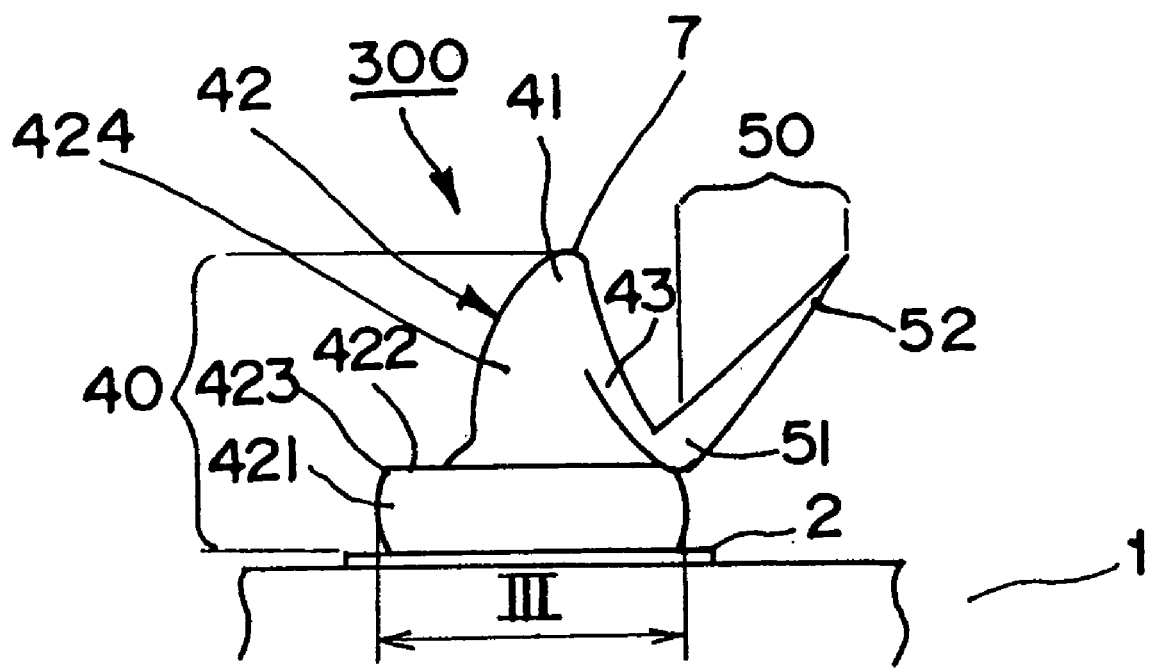
FIG. 7 is a side view showing another example of the shape of the bump shown in FIG. 4.

Next, as shown in FIG. 5C, the ball 11 formed at the tip end portion 10a of the wire 10 is bonded onto the electrode 2 of the semiconductor element 1 by means of pressure, heat or supersonic vibration applied from the capillary 9. The shape of the formed portion 42 of the first protrusion 40 formed on the electrode 2 by the ball 11 formed by thus melting the wire 10 is determined by the shape of the tip end portion 9a of the capillary 9. Therefore, the formed portion 42 is allowed to have an approximately conical shape as shown in FIG. 4 or a shape having a two-step protrusion comprised of a base portion 421 at which a shoulder portion 422 is formed and a protruding portion 424 provided upright on the base portion 421 as shown in FIG. 7. In a bump 300 having the base portion 421 of the above-mentioned type, due to the provision of the shoulder portion 422, the conductive adhesive is transferred only to the protruding portion 424 in transferring the conductive adhesive to the bump 300, and this produces the effect that the conductive adhesive can be prevented from spreading to the circuit forming surface 1a of the semiconductor element 1 by virtue of the shoulder portion 422 and the base portion 421. It is to be noted that this bump 300 is taken as an example in the following description.

In the wire 10, a proximate portion 10b in the vicinity of the ball 11 is subjected to looping by the capillary 9 as indicated by a course 14 in a plane parallel to the vertical direction above the base portion 421 as shown in FIG. 5D. In FIG. 5D, the distance of the movement of the capillary 9 is slightly exaggerated for the looping, and the looping is practically performed above a planar area III of the base portion 421. It is to be noted that the planar area III has a dimension of about 80 μm in the present seventh embodiment.

Figure 5E:
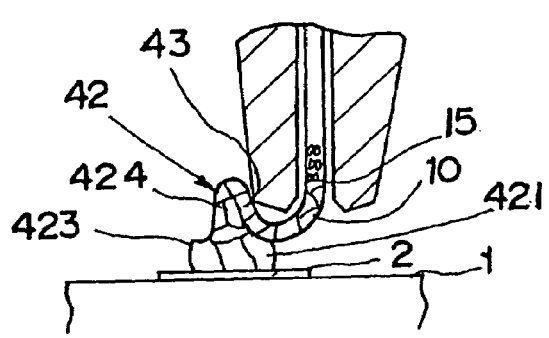

By the last motion 14a of the movement of the above-mentioned looping, the proximate portion 10b continuous with the protruding portion 424 extends downwardly from the vertex portion 41 of the formed portion 42, and as shown in FIG. 5E, the proximate portion 10b is bonded to the peripheral portion 423 of the base portion 421 by pressure, heat or supersonic vibration. Thus the first protrusion 40 is formed. Therefore, the first protrusion 40 is comprised of the formed portion 42 and the wire material portion 43 which has been formed of the proximate portion 10b, extended from the vertex portion 41 and bonded to the peripheral portion 423. The above-mentioned looping is performed for the purpose of preventing the vertex portion 41 from falling to the semiconductor element side in accordance with the downward movement of the proximate portion 10b from the vertex portion 41 of the formed portion 42.

Figure 5F:
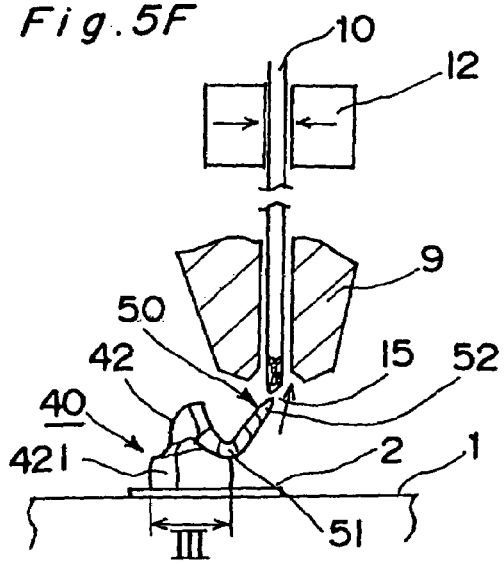

Next, a damper 12 provided for the capillary 9 clamps the wire 10 extending inside the capillary 9, and thereafter, the wire 10 bonded to the peripheral portion 423 of the base portion 421 is orientated upwardly with the elevation of the capillary 9 as shown in FIG. 5F and then torn off at the crystal grain interface 15 with the further elevation of the capillary 9. Thus the aforementioned second protrusion 50 is formed. By the operation of the capillary 9 as described above, the terminal end 52 of the second protrusion 50 extends beyond the aforementioned planar area III of the first protrusion 40 to a height positioned between the end 51 bonded to the aforementioned peripheral portion 423 and the approximate vertex portion 41 of the first protrusion 40. It is to be noted that the position of the crystal grain interface 15 is controlled in the direction in which the wire 10 extends by controlling the aforementioned discharge time as described above so that the terminal end 52, i.e., the portion approximately identical to the crystal grain interface 15 is arranged in height in a position between the abovementioned end 51 and the approximate vertex portion 41. Thus, one bump having two protrusions on one electrode 2 is obtained.

The wire 10 is continued from the wire material portion 43 of the first protrusion 40 to the second protrusion 50 in the aforementioned embodiments. However, it is acceptable to bond the end portion of the wire material portion 43 to, for example, the peripheral portion 423 of the base portion 421, cut it once, bond the end 51 of the second protrusion 50 to, for example, the peripheral portion 423 and extend the terminal end 52 as described above.

The looping of the wire 10 is performed so that the vertex portion 41 of the first protrusion 40 is arranged in a position approximately in the vertical direction with respect to the electrode 2 in the aforementioned embodiments. However, the looping may not be performed so long as the vertex portion 41 can be arranged in a position in the vertical direction without performing the looping.

The bumps 300 and 3 are each formed on the electrode 2 of the semiconductor element 1 in the aforementioned embodiments. However, the bumps 300 and 3 may be each formed on the board electrode on the circuit board on which the semiconductor element 1 is mounted.

Figure 19A:
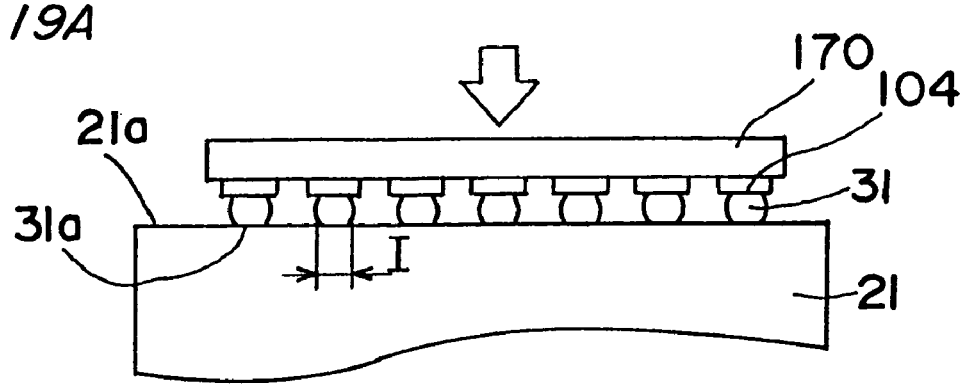
FIGS. 19A, 19B, and 19C are views for explaining a procedure for forming a semiconductor device by connecting a semiconductor element having a prior art bump to a circuit board.
Figure 19B:
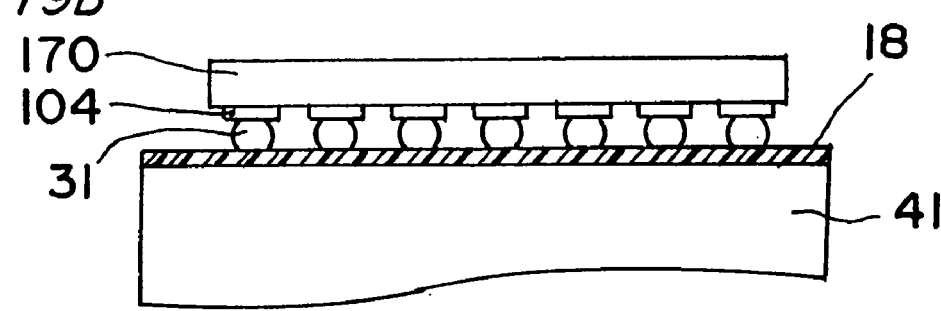
Figure 19C:
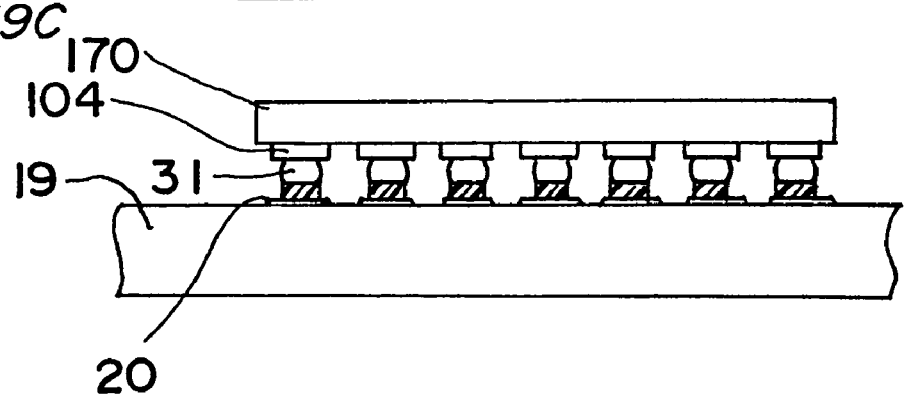
Figure 20A:
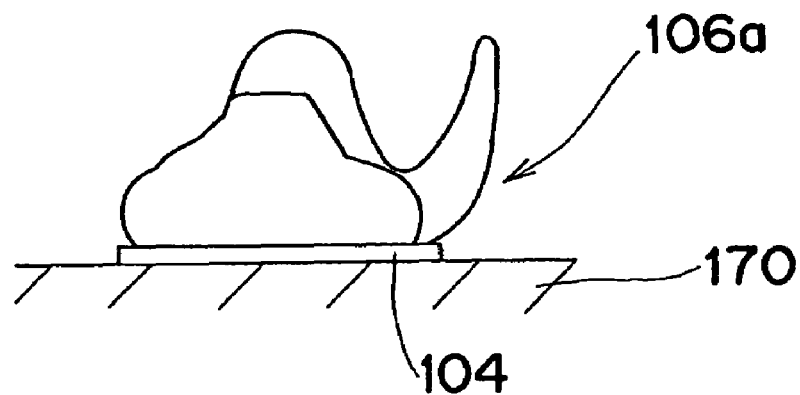
FIGS. 20A, 20B, and 20C are sectional views showing an abnormal shape of a bump electrode formed on an IC electrode.
Figure 20B:
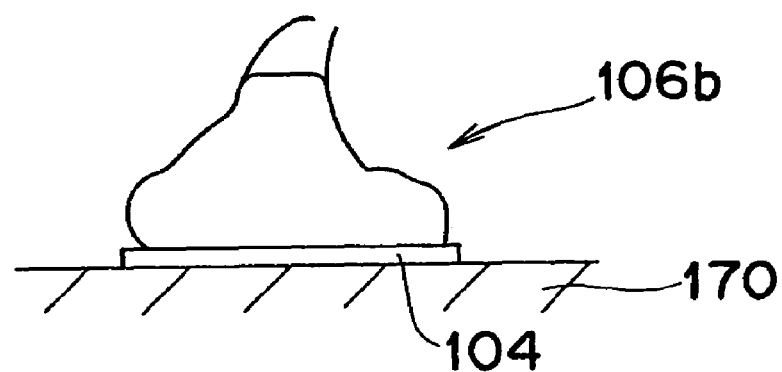
Figure 20C:
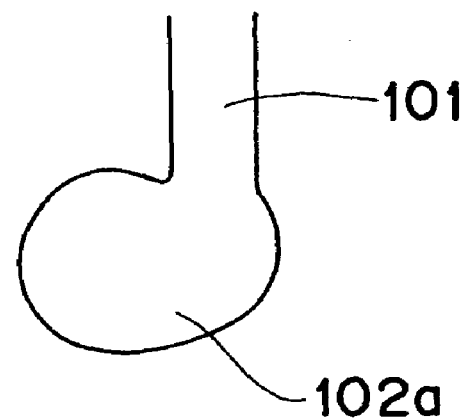

Next, the following will describe the case where a semiconductor device is formed by mounting the semiconductor element 1 provided with the aforementioned bump 300 or bump 3 on a circuit board via the above-mentioned bump 300 etc. It is to be noted that the following description will be made taking the bump 300 as an example. It is to be noted that the above-mentioned mounting operation is similar to the operation described with reference to FIGS. 19A through 19C.

Figure 8A:
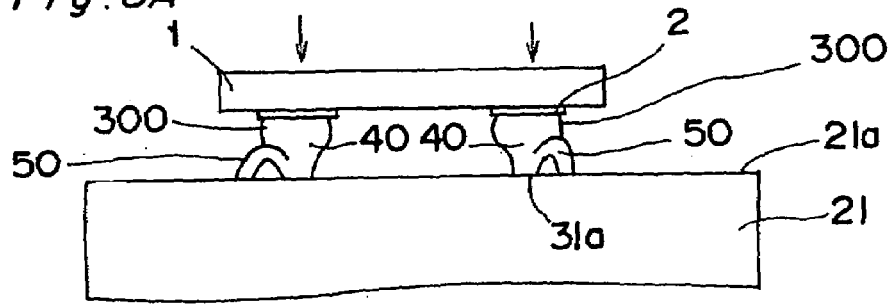
FIGS. 8A, 8B, 8C, and 8D are views for explaining a procedure for forming a semiconductor device by connecting a semiconductor element having the bumps shown in FIG. 7 to a circuit board.

In regard to the semiconductor element 1 provided with the aforementioned bump 300, by pressing the semiconductor element 1 to the base material side as shown in FIG. 8A, the vertex portions 7 of the first protrusion 40 and the second protrusion 50 of the bump 300 are pressed against the flat surface 21a of the board 21, thereby forming flat surfaces 31a at the respective vertex portions 7.

Figure 8B:
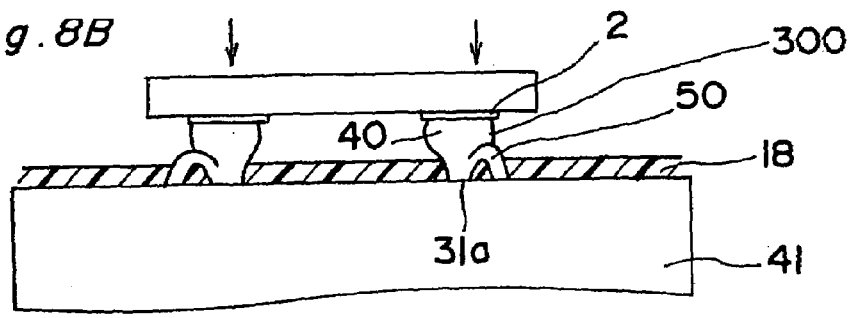

Next, as shown in FIG. 8B, by bringing the flat surface side of the bump 300 in contact with the conductive adhesive 18 formed on the flat surfaces of a stage 41, the conductive adhesive 18 is transferred onto the first protrusion 40 and the second protrusion 50.

Figure 8C:
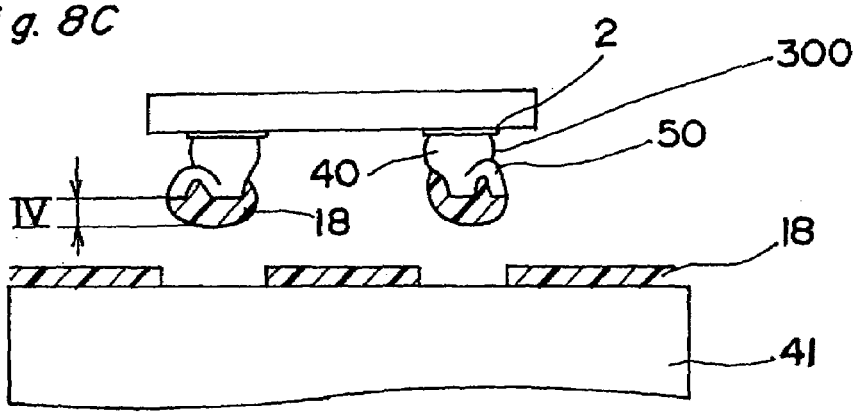
Figure 8D:
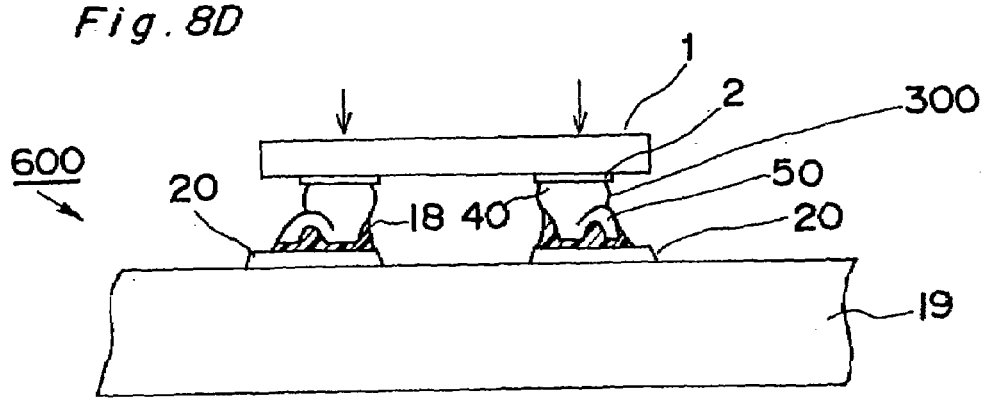

Next, as shown in FIG. 8D, the bump 300 on which the conductive adhesive 18 has been transferred is aligned with the board electrode 20 of the circuit board 19, and the first protrusion 40 and the second protrusion 50 of each bump 300 are fixed on the board electrode 20 by the conductive adhesive 18. Thus a semiconductor device 600 is fabricated.

Figure 9:
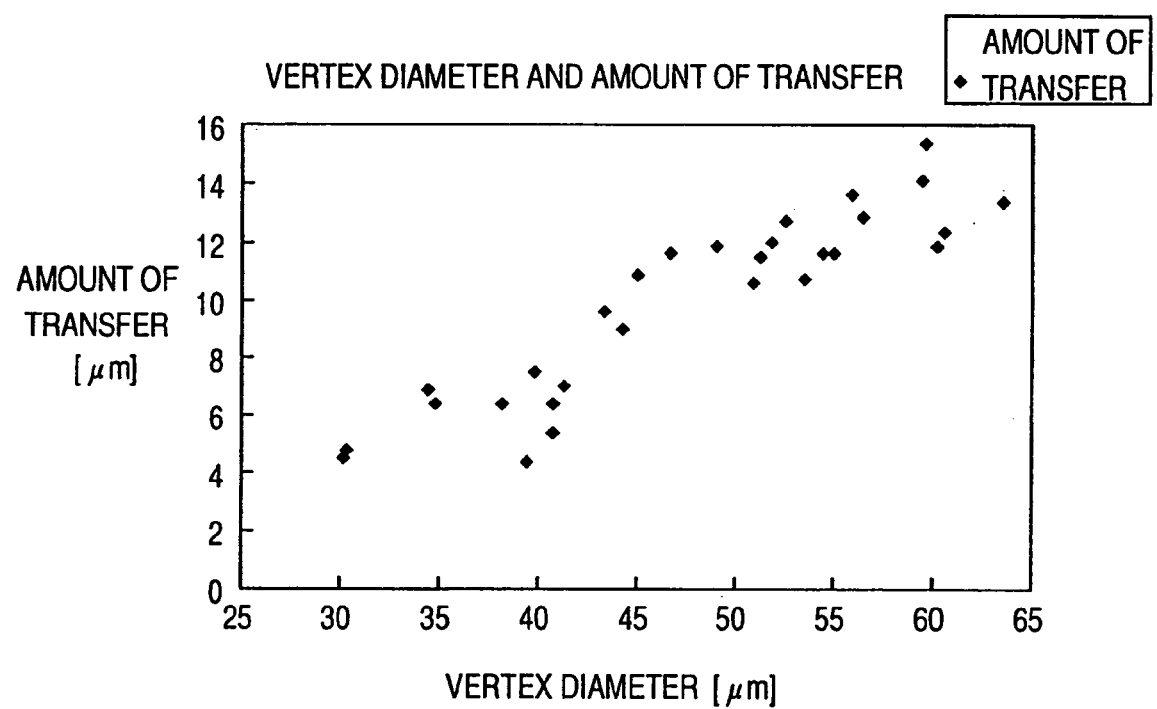
FIG. 9 is a graph showing a relationship between the size of a vertex portion of a bump and the amount of transfer of a conductive adhesive transferred to the bump.

By virtue of the provision of the two protrusions, including the first protrusion 40 and the second protrusion 50, the amount of transfer of the conductive adhesive 18 onto the vertex portions 7, i.e., the height IV of the conductive adhesive 18 as shown in FIG. 8C is increased. Further, by forming the flat surfaces 31a on the vertex portions 7 of the first protrusion 40 and the second protrusion 50, the area of the vertex portions 7 is further increased. As shown in FIG. 9, the above-mentioned amount of transfer increases as the area of the vertex portions 7 increases, and therefore, the amount of transfer can be increased by forming the flat surface 31a. In the above-mentioned manner, the conductive adhesive 18 can be transferred onto the bump 300 by the height IV of 10 µm or greater as shown in FIG. 8C.

Furthermore, the warp of the circuit board 19 in the case where the semiconductor element 1 is connected to the circuit board 19 is absorbed (i.e. compensated for) by the above-mentioned amount of transfer of the conductive adhesive 13, and therefore, the increase in amount of transfer as described above allows the amount of absorption of the warp to be increased. Therefore, the specification of the warp at the portion in which the semiconductor element 1 is connected to the circuit board 19 can be alleviated to 10 µm from the conventional specification of 4 µm, also allowing the circuit board 19 to be reduced in cost.

Furthermore, the connection area of the bump 300 and the board electrode 20 on the circuit board 19 as well as the amount of the conductive adhesive 18 are increased, so that the strength of connecting the bump 300 to the electrode 20 can be increased and the connection resistance value can be suppressed to a low value.

It is to be noted that, by virtue of the formation of the first protrusion 40 and the second protrusion 50 at the bump 300, the flat surface 31a may not be formed in the case where a sufficient amount of transfer of the conductive adhesive 18 onto the bump 300 can be assured without forming the flat surface 31a.

Figure 16:
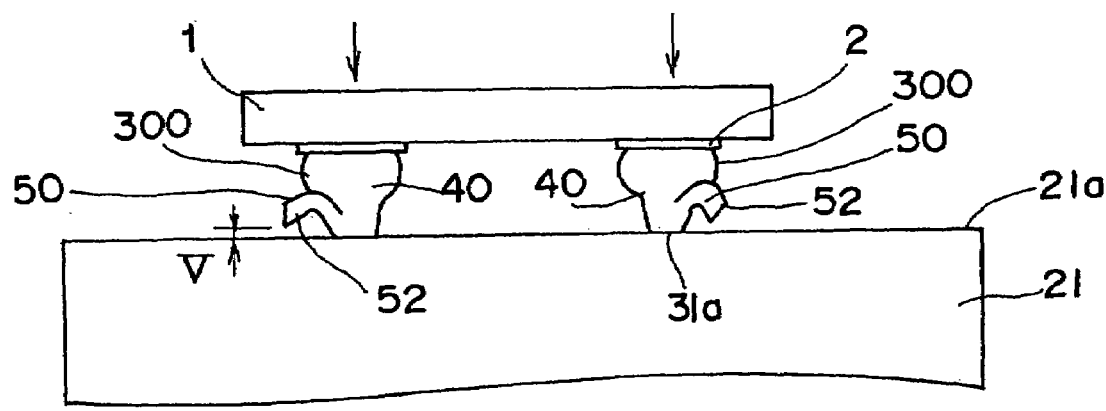
FIG. 16 is a view showing the case where a flat surface is formed on the bump shown in FIG. 15 by means of the board.
Figure 17A:
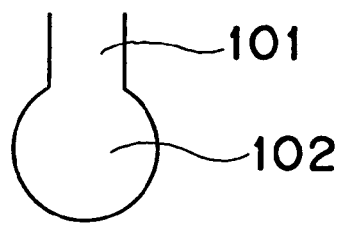
FIGS. 17A, 17B, 17C, and 17D are sectional views showing a prior art method of forming a bump electrode on an IC electrode.
Figure 17B:
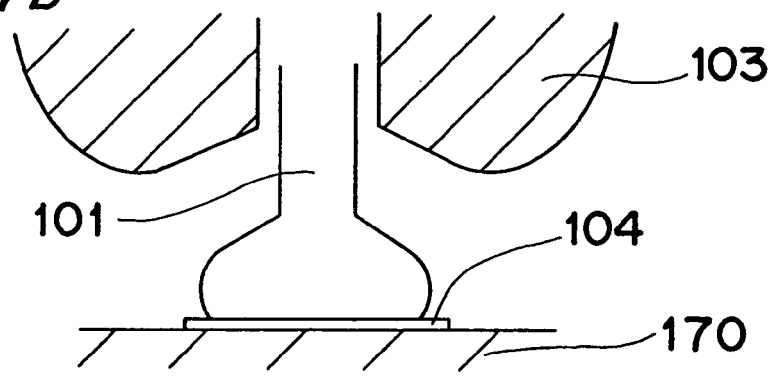
Figure 17C:
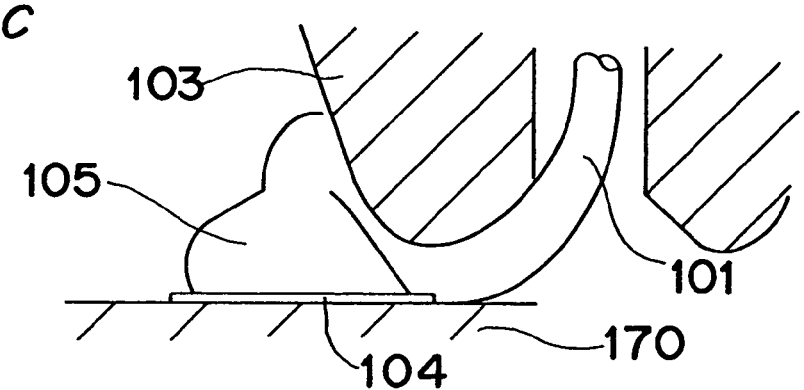
Figure 17D:
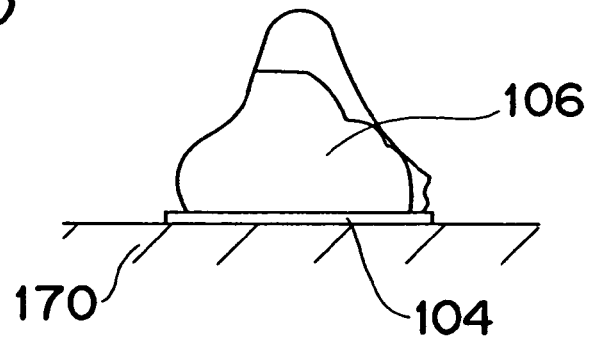

Furthermore, in the case where the terminal end 52 of the second protrusion 50 does not extend to the height of the vertex portion 7 of the first protrusion 40 and the semiconductor element 1 is not pressed against the above-mentioned board 21 to such an extent that the flat surface 21a of the board 21 contacts the terminal end 52 as shown in FIG. 15, it is sometimes the case where the flat surface 31a is formed only on the vertex portion 7 of the first protrusion 40 as shown in FIG. 16 and no flat surface 31a is formed at the terminal end 52 of the second protrusion 50.

In the case as described above, the conductive adhesive 18 is required to be transferred onto the terminal end 52. Accordingly, in the case where the terminal end 52 of the second protrusion 50 does not extend to the height of the vertex portion 7 of the first protrusion 40 as shown in FIG. 15, a gap V between the flat surface 21a of the board 21 and the terminal end 52 when the semiconductor element 1 is pressed to the board side has a dimension such that the conductive adhesive 18 can be transferred to the terminal end 52 when the bump 300 is brought in contact with the conductive adhesive 18 as shown in FIG. 8B. In other words, in the case where the other end 52 of the second protrusion 50 does not extend to the height of the vertex portion 7 of the first protrusion 40 as shown in FIG. 15, the bump 300 of the semiconductor element 1 is required to be pressed against the board 21 so that the dimension of the gap between the flat surface 21a of the board 21 and the terminal end 52 becomes not greater than the above-mentioned gap V.

A direction in which the terminal end 52 of the second protrusion 50 is orientated will be described next.

Figure 10:
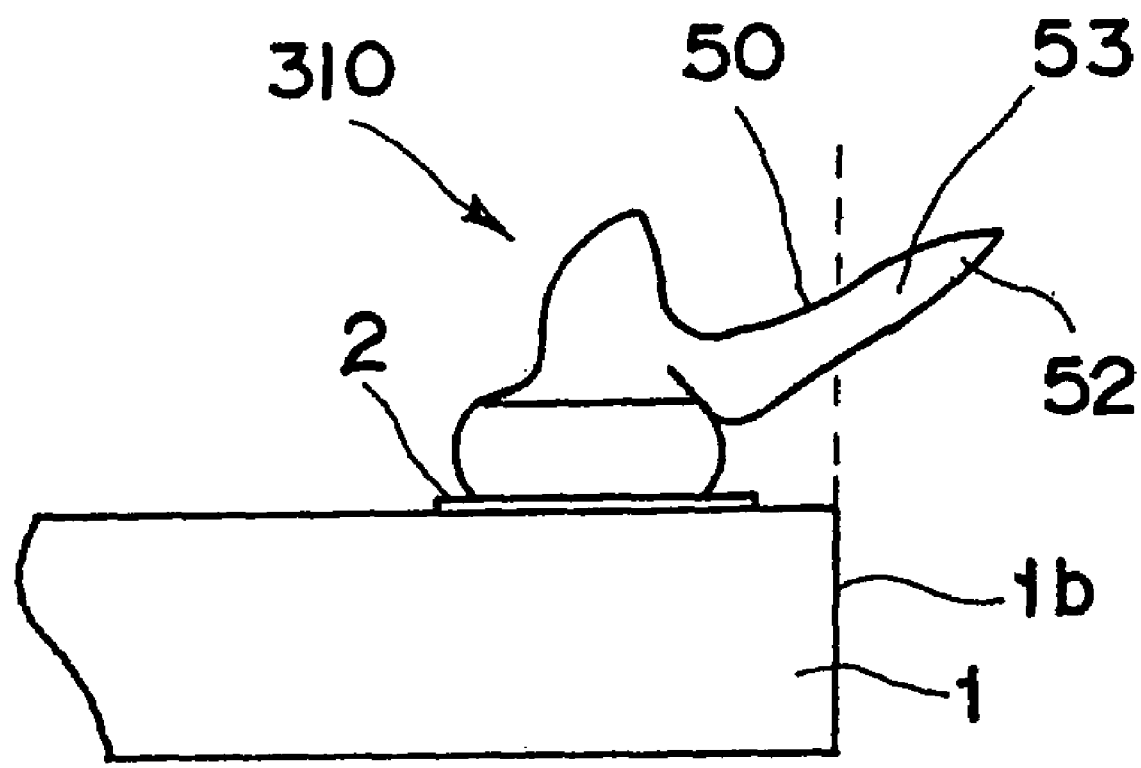
FIG. 10 is a side view of the bump shown in FIG. 7 at which the other end of the second protrusion is made to protrude from an end surface of the semiconductor element.

The terminal end 52 of the second protrusion 50 at the bump 300 formed as described above can be orientated to the peripheral side of the semiconductor element 1, or as further shown in FIG. 10, the terminal end 52 can also be extended beyond an extension line of the outer end surface 1b of the periphery of the semiconductor element 1. It is to be noted that the orientation of the terminal end 52 is effected by the operation of the capillary 9. In regard to the bump 300, a bump at which the terminal end 52 is extended beyond the extension line of the outer end surface 1b of the periphery of the semiconductor element 1 is denoted by a bump 310 as shown in FIG. 10. Further, the portion which belongs to the wire 10 and extends beyond the extension line of the outer end surface 1b is denoted by an outwardly protruding portion 53.

By thus orientating the terminal end 52 to the peripheral side of the semiconductor element 1, the terminal end 52 does not extend toward the adjacent electrode 2 in the semiconductor element 1. Therefore, the terminal end 52 is not brought in contact or short-circuited with the adjacent electrode 2 when the conductive adhesive 18 is transferred to the bump 310. Therefore, the orientation of the terminal end 52 to the peripheral side of the semiconductor element 1 can assure the amount of transfer of the conductive adhesive 18 and prevent the possible occurrence of the short circuit as described above by virtue of the provision of the second protrusion 50 in addition to the first protrusion 40.

Further, a semiconductor device can also be fabricated by forming the bump 310 on the electrode 2 of the semiconductor element 1 as described above in Step 1 shown in FIG. 11 and connecting the bump 310 onto the electrode 20 of the circuit board 19 in a face-down mounting manner in Step 2. When fabricating the semiconductor device as described above, the terminal end 52 is neither brought in contact or short-circuited with the adjacent electrode 2 in the semiconductor element 1 having the bump 310.

Furthermore, the second protrusion 50 of the bump 310 has the outwardly protruding portion 53. For the above reason, when the bump 310 is connected to the electrode 20 on the circuit board 19, its connection area is greater than that of, for example, the bump 300. Therefore, the connection strength can be made higher and the connection resistance value can be made lower.

Figure 11:
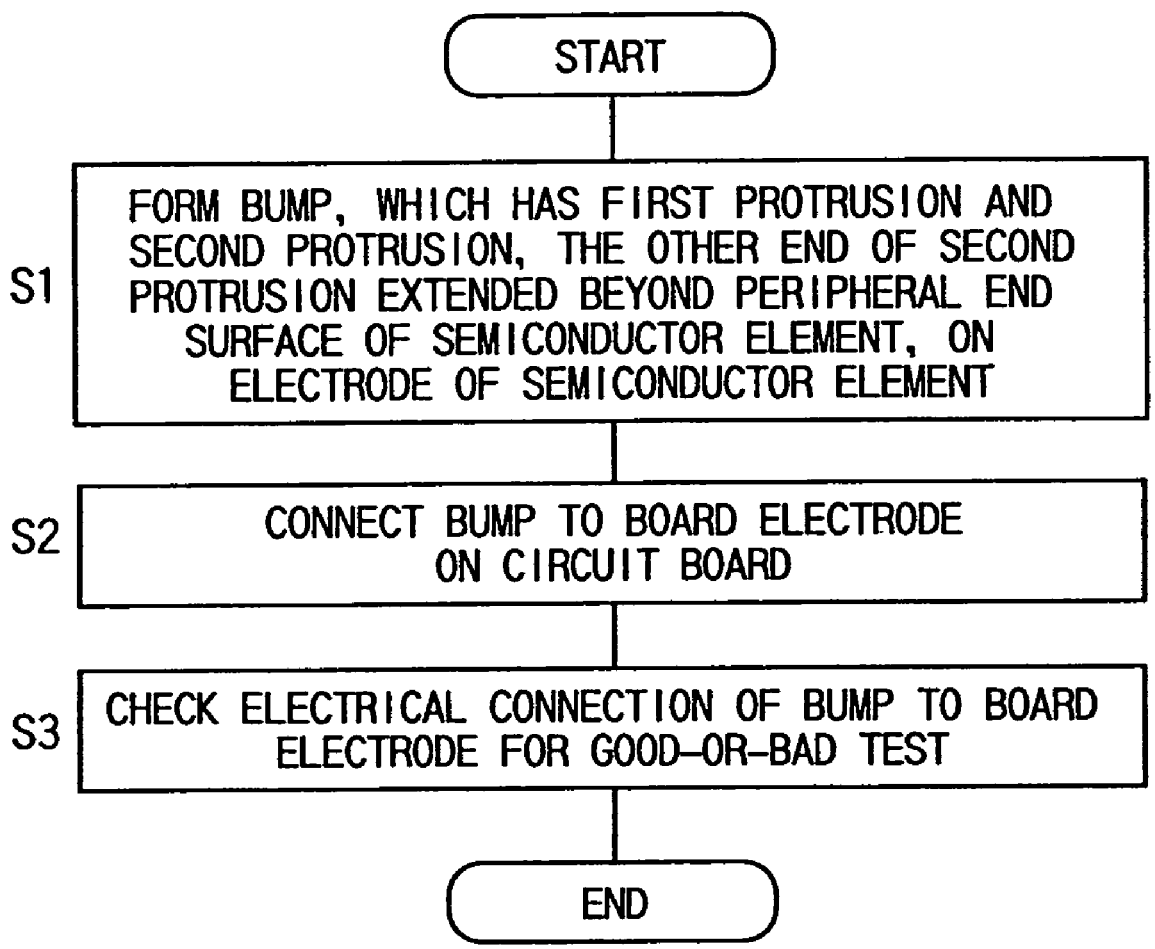
FIG. 11 is a flowchart of a process for fabricating a semiconductor device with the semiconductor element of a ninth of the present invention.

Furthermore, in a semiconductor device 610 in which the semiconductor element 1 having the bump 310 is connected to the circuit board 19 (see FIG. 12), a test process for testing the performance of the electrical connection of the bump 310 to the electrode 20 on the circuit board 19 can be provided as one fabricating process of the semiconductor device 610 as shown in Step 3 in FIG. 11. This test will be described below.

For example, when the semiconductor element 1 having the bump 300 is mounted on the circuit board 19 in the face-down mounting manner, the terminal end 52 of the second protrusion 50 is not protruding from the outer end surface 1b of the periphery of the semiconductor element 1. Therefore, the portion in which the bump 300 is connected to the electrode 20 on the circuit board 19 cannot be visually checked. When the semiconductor element 1 having the bump 310 is mounted on the circuit board 19 in the face-down mounting manner, the outwardly protruding portion 53 is protruding from the outer end surface 1b of the periphery of the semiconductor element 1. Therefore, the portion in which the bump 310 is connected to the electrode 20 on the circuit board 19 can be viewed via the outwardly protruding portion 53 and subjected to a visual test.

Figure 12:
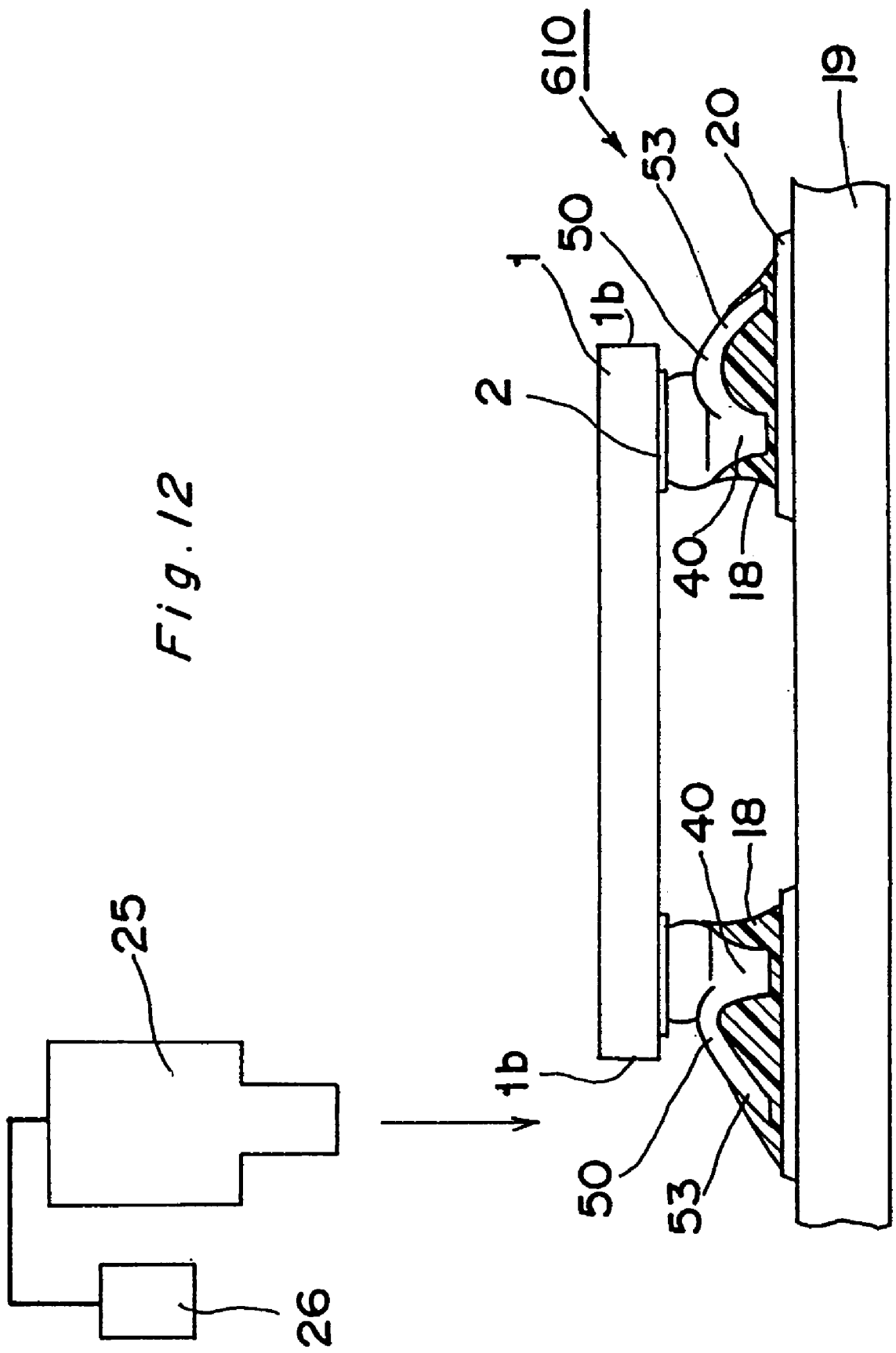
FIG. 12 is a view showing an example of the method of testing a semiconductor device fabricated with a semiconductor element having the bump shown in FIG. 10.

Furthermore, it is acceptable to automatically execute the above-mentioned visual test by means of a camera 25 and a visual tester 26 connected to the camera 25 as shown in FIG. 12. That is, the electrical connection of the bump 310 to the electrode 20 can be checked in a good-or-bad test by picking up the image of the portion in which the outwardly protruding portion 53 is connected to the electrode 20 by the camera 25, taking the image into the visual tester 26, and detecting the presence or absence of the conductive adhesive 18 in the connection portion by means of the visual tester 26.

Furthermore, in the semiconductor device 610 employing the semiconductor element 1 having the bump 310, a contact probe 26 can be brought in contact with the outwardly protruding portion 53 or the conductive adhesive 18 which covers the outwardly protruding portion 53 as shown in FIG. 13. The contact probe 26 is connected to a semiconductor element performance tester 27 which can check the state of connection of the bump 310 to the electrode 20 of the circuit board 19 or the operation of the semiconductor element 1. Therefore, by executing, for example, a diode characteristic test, it can be checked in a short time whether the connection of the electrode 2 of the semiconductor element 1 to the electrode 20 of the circuit board 19 is in a non-conductive state or short-circuited.

It is to be noted that the above-mentioned diode characteristic test is to test the diode formed in the circuit of the semiconductor element 1 for the purpose of preventing an excessive current from flowing through the circuit of the semiconductor element 1.

Figure 14A:
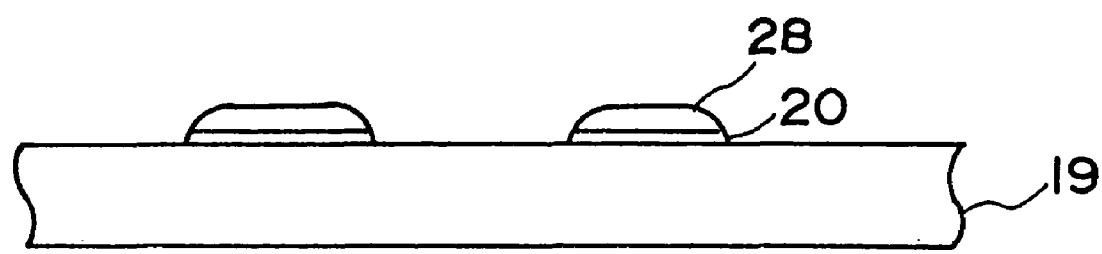
FIGS. 14A and 14B are views showing the case where bumps are connected to board electrodes of a circuit board by means of solder in fabricating a semiconductor device with a semiconductor element of a tenth embodiment of the present invention.
Figure 14B:
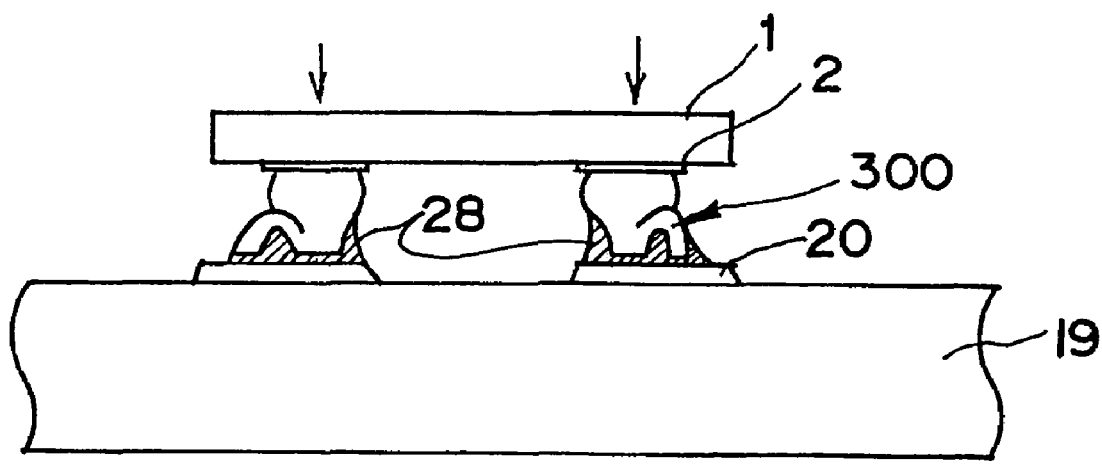

The connection of the bump to the electrode 20 of the circuit board 19 is achieved by the conductive adhesive 18 according to the description of the above-mentioned embodiment. However, as shown in FIGS. 14A and 14B, solder 28 can be used instead of the conductive adhesive 18. It is to be noted that the bump 300 is taken as an example, in FIGS. 14A and 14B.

Similarly to the case described with reference to FIGS. 8A–8D, the vertex portions 7 of the first protrusion 40 and the second protrusion 50 of the bump 300 of the semiconductor element 1 are provided with respective flat surfaces 31a. On the other hand, as shown in FIG. 14A, solder 28 is provided on the electrode 20 of the circuit board 19. Then, as shown in FIG. 14B, by aligning in position the bump 300 of the semiconductor element 1 with the electrode 20 of the circuit board 19, bringing the flat surfaces 31a of the bump 300 into contact with the solder 28 and heating the same, the two protrusions of the first protrusion 40 and the second protrusion 50 of the bump 300 are connected to the electrode 20 of the circuit board 19 via the solder 28.

By thus connecting the electrode 20 of the circuit board 19 with the bump 300 having the first protrusion 40 and the second protrusion 50 by means of solder; a solder fillet is formed. By virtue of the provision of this fillet, the strength against a stress effected on the circuit board 19 is increased and the connection reliability is improved. Furthermore, the connection area is increased and the connection resistance value is reduced.

The bump having two protrusions is formed by the ball bonding method in the aforementioned embodiment. However, it is a matter of course that a method capable of forming two protrusions on at least one bump can be used instead of the ball bonding method.

As described in detail above, according to the semiconductor elements as well as the semiconductor element fabricating method of the present invention, two protrusions are provided on one bump. Therefore, the area of contact of the bump with the board electrode on the circuit board is increased. Accordingly, the connection strength and the connection reliability can be made high and the connection resistance value can be made low and stable in connecting the semiconductor element to the circuit board.

Furthermore, according to the semiconductor device and the semiconductor device fabricating method of the present invention, the semiconductor element having two protrusions at one bump, as described above, is used and the bump is connected to the board electrode of the circuit board. With this arrangement, the area of contact of the bump with the board electrode on the circuit board is increased, and accordingly, the connection strength and the connection reliability of the semiconductor element and the circuit board can be made high and the connection resistance value can be made low and stable in the semiconductor device.

Furthermore, according to the semiconductor device fabricating method of the present invention, the end portion of the second protrusion is extended outwardly of the semiconductor element beyond the periphery of the semiconductor element at the bump having two protrusions. This arrangement of course enables the improvement of the connection strength and the connection reliability and the reduction and stabilization of the connection resistance value as described above and allows the semiconductor device to be tested by means of the second protrusion extended outwardly of the semiconductor element.

The entire disclosure of Japanese Patent Application No. 8-260645 filed on Oct. 1, 1996, and No. 8-289836 filed on Oct. 31, 1996, including specification, claims, drawings, and summary are incorporated herein by reference in their entirety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A semiconductor arrangement in which one bump electrode having two protrusions is bonded to an IC electrode on a circuit forming surface of a semiconductor element by a method comprising operating a bonding capillary at a ball bond forming position to form a ball bond portion on the IC electrode, moving the bonding capillary upward with respect to the IC electrode, moving the bonding capillary sideways and then downward with respect to the IC electrode, bonding a wire to the ball bond portion, and cutting the wire, the wire being prevented from coming in contact with portions around the ball bond portion other than the ball bond portion itself by presetting a descent position of the bonding capillary to a position higher than the ball bond forming position; and
    wherein said two protrusions are brought in contact with or put close to one electrode on a circuit board when the semiconductor element is mounted on the circuit board.

2. A semiconductor arrangement as claimed in claim 1, wherein the electrode on the circuit board and said bump electrode are electrically connected to each other.

3. A semiconductor arrangement as claimed in claim 1, wherein no space is circumscribed by the wire and ball bond portion.

4. A semiconductor arrangement in which a bump electrode is bonded to an IC electrode on a circuit forming surface of a semiconductor element by a method comprising operating a bonding capillary at a ball bond forming position to form a ball bond portion on the IC electrode, moving the bonding capillary upward with respect to the IC electrode, moving the bonding capillary sideways and then downward with respect to the IC electrode, bonding a wire to the ball bond portion, and cutting the wire, the wire being prevented from coming in contact with portions around the ball bond portion other than the ball bond portion itself by presetting a descent position of the bonding capillary to a position higher than the ball bond forming position;
    wherein said bump electrode comprises:
    a first protrusion which is comprised of a portion formed by once melting and solidifying a wire and its periphery and is bonded to said IC electrode; and
    a second protrusion which is formed of an unmelted portion of said wire and extended from said first protrusion beyond a planar area defined by projecting said first protrusion to a height approximately equal to that of said first protrusion with respect to said IC electrode;
    wherein said first protrusion and said second protrusion are brought in contact with or put close to one electrode on a circuit board when the semiconductor element is mounted on the circuit board; and
    wherein said first protrusion is provided with a formed portion formed by forming a melted portion of said wire by a capillary and solidifying the same and a wire material portion which is comprised of the wire in a vicinity of said melted portion, extended from a vertex portion of said formed portion downwardly from said vertex portion and bonded to said electrode.

5. A semiconductor arrangement in which a bump electrode is bonded to an IC electrode on a circuit forming surface of a semiconductor element by a method comprising operating a bonding capillary at a ball bond forming position to form a ball bond portion on the IC electrode, moving the bonding capillary upward with respect to the IC electrode, moving the bonding capillary sideways and then downward with respect to the IC electrode, bonding a wire to the ball bond portion, and cutting the wire, the wire being prevented from coming in contact with portions around the ball bond portion other than the ball bond portion itself by presetting a descent position of the bonding capillary to a position higher than the ball bond forming position;
    wherein said bump electrode comprises:
    a first protrusion which is comprised of a portion formed by once melting and solidifying a wire and its periphery and is bonded to said IC electrode; and
    a second protrusion which is formed of an unmelted portion of said wire and extended from said first protrusion beyond a planar area defined by projecting said first protrusion to a height approximately equal to that of said first protrusion with respect to said IC electrode;
    wherein said first protrusion and said second protrusion are brought in contact with or put close to one electrode on a circuit board when the semiconductor element is mounted on the circuit board; and
    wherein said first protrusion and said second protrusion have respective flat surface portions at the vertex portions of the protrusions.

* * * * *

UNITED STATES PATENT AND TRADEMARK OFFICE
CERTIFICATE OF CORRECTION

| | | |
|---|---|---|
| PATENT NO. | : 7,071,090 B2 | |
| APPLICATION NO. | : 11/073714 | |
| DATED | : July 4, 2006 | |
| INVENTOR(S) | : Kazushi Higashi et al. | |

It is certified that error appears in the above-identified patent and that said Letters Patent is hereby corrected as shown below:

On the Title Page

Item (*) Notice, please add the following sentence --This patent is subject to a terminal disclaimer.--

Signed and Sealed this

Twelfth Day of December, 2006

JON W. DUDAS
*Director of the United States Patent and Trademark Office*